(12) United States Patent
Nozaki et al.

(10) Patent No.: US 8,420,288 B2
(45) Date of Patent: Apr. 16, 2013

(54) RESIST PATTERN THICKENING MATERIAL, METHOD FOR FORMING RESIST PATTERN, SEMICONDUCTOR DEVICE AND METHOD FOR MANUFACTURING THE SAME

(75) Inventors: Koji Nozaki, Kawasaki (JP); Miwa Kozawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 675 days.

(21) Appl. No.: 11/831,576

(22) Filed: Jul. 31, 2007

(65) Prior Publication Data
US 2008/0073322 A1    Mar. 27, 2008

(30) Foreign Application Priority Data

Sep. 26, 2006 (JP) ................................ 2006-260854
Jul. 20, 2007 (JP) ................................ 2007-189182

(51) Int. Cl.
*G03F 7/004* (2006.01)
(52) U.S. Cl.
USPC ..................................... 430/270.1; 430/273.1
(58) Field of Classification Search ............... 430/270.1, 430/273.1, 905
See application file for complete search history.

(56) References Cited

U.S. PATENT DOCUMENTS

| | | | |
|---|---|---|---|
| 4,283,475 A * | 8/1981 | Kawamura et al. ............. 430/70 |
| 5,063,134 A * | 11/1991 | Horiguchi et al. ............ 430/192 |
| 5,512,417 A * | 4/1996 | Ban et al. .................. 430/270.14 |
| 5,633,111 A * | 5/1997 | Yoshimoto et al. ........... 430/165 |
| 5,955,241 A * | 9/1999 | Sato et al. .................. 430/270.1 |
| 6,534,243 B1 | 3/2003 | Templeton et al. |
| 6,555,607 B1 | 4/2003 | Kanda et al. |
| 6,566,040 B1 | 5/2003 | Sugino et al. |
| 6,579,657 B1 | 6/2003 | Ishibashi et al. |
| 7,072,565 B2 * | 7/2006 | Shelnut et al. ................. 385/143 |
| 7,585,610 B2 * | 9/2009 | Nozaki et al. ............. 430/270.1 |
| 2004/0029047 A1 | 2/2004 | Ishibashi et al. |
| 2004/0072096 A1 * | 4/2004 | Terai et al. .................. 430/270.1 |
| 2004/0072098 A1 | 4/2004 | Kozawa et al. |
| 2005/0008661 A1 * | 1/2005 | Fereira et al. ................. 424/400 |
| 2006/0029811 A1 * | 2/2006 | Sugioka et al. ............... 428/413 |
| 2006/0183218 A1 * | 8/2006 | Takahashi et al. ......... 435/287.8 |
| 2006/0188805 A1 | 8/2006 | Nozaki et al. |
| 2006/0188807 A1 | 8/2006 | Nozaki et al. |
| 2007/0048659 A1 * | 3/2007 | Namiki et al. ............. 430/270.1 |
| 2009/0226844 A1 * | 9/2009 | Nozaki et al. .................. 430/296 |

FOREIGN PATENT DOCUMENTS

| | | | |
|---|---|---|---|
| EP | 1398671 A1 | 3/2004 |
| EP | 1429185 A1 | 6/2004 |
| EP | 1693709 A1 | 8/2006 |
| JP | 62-065326 A | 3/1987 |
| JP | 05-107763 | * | 4/1993 |
| JP | 5-197151 A | 8/1993 |
| JP | 10-73927 A | 3/1998 |
| JP | 11-204399 A | 7/1999 |
| JP | 11-283910 A | 10/1999 |
| JP | 2000-58506 A | 2/2000 |
| JP | 2000-267268 A | 9/2000 |
| JP | 2000-298356 A | 10/2000 |
| JP | 2000-347414 A | 12/2000 |
| JP | 2001-19860 A | 1/2001 |
| JP | 2001-033984 A | 2/2001 |
| JP | 2001-228616 A | 8/2001 |
| JP | 2002-6491 A | 1/2002 |
| JP | 2002-6512 A | 1/2002 |
| JP | 2002-49161 A | 2/2002 |
| JP | 2003-84457 A | 3/2003 |
| JP | 2003-131400 A | 5/2003 |
| JP | 2004-53723 A | 2/2004 |
| JP | 2004-86203 A | 3/2004 |
| JP | 2004-126080 A | 4/2004 |
| JP | 2004-264373 A | 9/2004 |
| JP | 2004-335358 | * | 11/2004 |
| JP | 2006-259692 A | 9/2006 |
| KR | 10-2006-0093024 A | 8/2006 |
| RO | 84528 | * | 8/1984 |
| WO | 2004074941 A1 | 9/2004 |

OTHER PUBLICATIONS

Machine translation of JP 2004-335358, Nov. 2004.*
Machine translation of JP 05-107763, published on Apr. 30, 1993.*
English abstract of RO 84528, published on Aug. 30, 1984.*
Takeo Ishibashi et al.; "Advanced Micro-Lithography Process with Chemical Shrink Technology", The Japan Society of Applied Physics, vol. 40, Part. 1, No. 1, Jan. 2001, pp. 419-425.
Mamoru Terai et al.; "Below 70-nm Contact Hole Pattern with RELACS Process for ArF Resist", Advances in Resist Technology and Processing XX, Proceedings of SPIE, vol. 5039, 2003, pp. 789-797.
Korean Office Action dated Aug. 27, 2008, issued in corresponding Korean Patent Application No. 10-2007-0077221.
Japanese Office Action dated Oct. 4, 2011, issued in corresponding Japanese Patent Application No. 2007-189182 (Partial Translation).
German Office Action dated Jan. 16, 2012, issued in corresponding German Patent Application No. 102007035766.6.

* cited by examiner

*Primary Examiner* — Anca Eoff
(74) *Attorney, Agent, or Firm* — Westerman, Hattori, Daniels & Adrian, LLP

(57) ABSTRACT

The present invention provides a resist pattern thickening material, which can utilize ArF excimer laser light; which, when applied over a resist pattern to be thickened, e.g., in form of lines and spaces pattern, can thicken the resist pattern to be thickened regardless of the size of the resist pattern to be thickened; and which is suited for forming a fine space pattern or the like, exceeding exposure limits. The present invention also provides a process for forming a resist pattern and a process for manufacturing a semiconductor device, wherein the resist pattern thickening material of the present invention is suitably utilized.

7 Claims, 17 Drawing Sheets

Thickening of resist pattern

RESIST PATTERN THICKENING MATERIAL, METHOD FOR FORMING RESIST PATTERN, SEMICONDUCTOR DEVICE AND METHOD FOR MANUFACTURING THE SAME

CROSS-REFERENCE TO RELATED APPLICATIONS

This application is based upon and claims the benefits of the priority from the prior Japanese Patent Application Nos. 2006-260854 filed on Sep. 26, 2006 and 2007-189182 filed on Jul. 20, 2007 the entire contents of which are incorporated herein by reference.

BACKGROUND OF THE INVENTION

1. Field of the Invention

The present invention relates to a resist pattern thickening material capable of forming a fine space pattern of resist, exceeding exposure limits (resolution limits) of light sources of available exposure devices by thickening a resist pattern to be formed when manufacturing a semiconductor device, and the present invention also relates to a method for forming a resist pattern, a semiconductor device, and a method for manufacturing the semiconductor device.

2. Description of the Related Art

Semiconductor integrated circuits are becoming more highly integrated, and LSIs and VLSIs are increasingly being put into practical use. Accompanying this trend, interconnection patterns are more finely formed. To form a fine interconnection pattern, a lithographic technique is very useful in which a substrate is coated with a resist film, is selectively exposed, and thereafter, is developed to thereby form a resist pattern, and the substrate is subjected to a dry etching treatment by using the resist pattern as a mask, and thereafter, by removing the resist pattern, the desired pattern, for example, an interconnection pattern is obtained. Utilization of such a lithographic technique with the use of an exposure light for microfabrication is still strongly demanded to keep high-productivity of patterns even now patterns are becoming increasingly fine. For this reason, for a light used for exposure, i.e, an exposure light not only a deep ultraviolet light having a shorter wavelength has been pursued, but also various inventive efforts have been done for mask pattern itself, for the shape of light source and the like. There is still much demand for developments of a technique allowing for life-prolonging of an exposure light to draw a fine pattern in an easy method.

To overcome the above technical problems, there has been proposed a technique that a resist pattern formed from a conventional resist material is thickened with the use of a resist pattern thickening material (hereinafter, may be sometimes referred to as "resist swelling material") capable of forming a fine space pattern of resist to thereby form a fine pattern. For example, a technique has been proposed in which a resist pattern is formed, then an aqueous solution material containing a polyvinyl acetal resin and a silicone resin each capable of affording crosslinkability as a base is applied over a surface of the resist pattern to form a coated film, the coated film is heated to thereby subjecting the coated film and the resist pattern to a crosslinking reaction at the contact interface therebetween by utilizing a residual acid in the resist pattern, and then the resist pattern is thickened (hereinafter, may be sometimes referred to as "swelled") by rinsing the surface of the crosslinked resist pattern with water or an alkaline aqueous solution to thereby shorten a distance between the respective lines of the resist pattern and form a fine space pattern of resist, thereby forming a desired pattern, for example, a desired interconnection pattern formed in the same shape as in the space pattern of resist (see Japanese Patent Application Laid-Open (JP-A) No. 11-283910). Further, for the above-noted aqueous solution material, a composition with a crosslinker further added thereto is proposed in view that a substantial amount of reduction of the width of space pattern of resist can be expected.

However, the type of chemical agents that can be linked to a coater/developer track to be used in semiconductor process at present is limited to resist materials and rinse solutions, and it is very difficult to set up a new process line for a new chemical agent. In the conventional semiconductor process, it is not based on the assumption that an aqueous solution material is applied over a surface of a resist pattern, and thus it is also difficult to use such an aqueous solution material because of the necessity of a new control for waste fluid.

In addition, with the use of such a conventional material composition utilizing a crosslinking reaction, it is difficult to control the amount of reaction, and there are the following shortcomings. It is liable to cause differences in the amount of reaction depending on the initial pattern size of a resist pattern, loss of a resist pattern caused by an embedded space pattern of resist dependence of the amount of reaction on the used pattern shape and the like, and the process margin is narrow.

From the perspective of forming a fine interconnection pattern, it is desired to utilize, as an exposure light, for example, an ArF (argon fluoride) excimer laser light having a wavelength of 193 nm which has a shorter wavelength than that of a KrF (krypton fluoride) excimer laser light (wavelength: 248 nm). In the meanwhile, when a pattern is formed utilizing an X-ray, an electron beam, or the like, each of which has a further shorter wavelength than that of the ArF (argon fluoride) excimer laser light (wavelength: 193 nm), it results in a high-cost and a low-productivity. Therefore, it is desirable to utilize the ArF (argon fluoride) excimer laser light (wavelength: 193 nm).

With the use of the composition for the aqueous solution material described in Japanese patent Application Laid Open (JP-A) No. 11-283910, it has been known that the use of the aqueous solution material composition is not effective in thickening (swelling) an ArF resist pattern containing a resin which is different from the resin used for KrF resist patterns, although it is effective in thickening (swelling) a KrF resist pattern using a phenol resin, and there is a problem that the aqueous solution material composition cannot be utilized for ArF resists which are typically used for processing advanced devices.

Furthermore, a reduced resist pattern using the polyvinyl acetal resin as a base, which is obtained by the technique described in Japanese Patent Application Laid-Open (JP-A) No. 11-283910 may be sometimes insufficient in dry etch resistance to cause a problem with processability. In the meanwhile, in case of a resist pattern using the silicone resin as a base, an etching residue of the silicone resin occurs, and therefore it is often needed to further remove the residue, and the resist pattern is not practical, although the dry etch resistance thereof is satisfactorily provided.

Therefore it is desired to develop a technique for forming a fine space pattern of resist and forming an interconnection pattern, etc. which is capable of using ArF (argon fluoride) excimer laser light as a light source during patterning without the necessity of setting up a new device, which is capable of sufficiently thickening an ArF resist pattern, etc. that cannot be sufficiently thickened or swelled by using the aqueous solution material containing the crosslinkable resin or the resin containing a crosslinker, at low cost, easily.

The present invention aims at solving the shortcomings in the prior art, and can achieve the following objects.

An object of the present invention is to provide a resist pattern thickening material which can utilize also an ArF (argon fluoride) excimer laser light as an exposure light during patterning; which is capable of thickening a resist pattern such as a lines & spaces pattern without depending on the size of a resist pattern to be thickened by only applying the resist pattern thickening material over the surface of the formed resist pattern formed from the ArF resist or the like; which can be rinsed with water or an alkaline developer; which is excellent in etch resistance; and which is capable of forming a fine space pattern of resist, exceeding exposure limits (resolution limits) of light sources of available exposure devices, at low cost, easily, and efficiently.

Another object of the present invention is to provide a method for forming a resist pattern which, during patterning a resist pattern, can utilize also an ArF excimer laser light as an exposure light without the necessity of setting up a new device; which is capable of thickening a resist pattern such as a lines & spaces pattern without depending on the size of a resist pattern to be thickened; and which is capable of forming a fine space pattern of resist, exceeding exposure limits (resolution limits) of light sources of available exposure devices, at low cost, easily, and efficiently.

Yet another object of the present invention is to provide a method for manufacturing a semiconductor device in which, during patterning a resist pattern, ArF excimer laser light can be utilized as a light source without the necessity of setting up a new device; a fine space pattern of resist, exceeding exposure or resolution limits of light sources of available exposure devices, can be formed; and which can efficiently mass-produce a high performance semiconductor having a fine interconnection pattern formed using the space patter of resist, and is to also provide a high performance semiconductor which is manufactured by the method for manufacturing a semiconductor device and has fine interconnection patterns.

In view of the above-mentioned shortcomings, the inventors of the present invention have investigated vigorously, and have obtained the following findings. Specifically, the present inventors found out that in swelling of a resist pattern using a conventional resist swelling agent containing an aliphatic resin, a silicone resin, a crosslinker and the like, the resist pattern cannot be thickened without the utilization of a crosslinking reaction caused by a residual acid, however, as a substitute for the conventional method, the use of a resist pattern thickening material which contains at least a resin, a benzyl alcohol, a benzylamine, and derivatives thereof, which is a nonaqueous material and contains no acid-generator and no crosslinker makes it possible to easily control reactions as well as to thicken the resist pattern without depending on the size of a resist pattern to be thickened because no crosslinking reaction is caused therein, and the resist pattern thickening material can be rinsed with water or an alkaline developer. The present inventors also found out that it is possible to obtain a resist pattern thickening material which is excellent particularly in etch resistance when a phenol resin, polyvinylpyrolidone and the like are used as the resin. These findings led to the completion of the present invention.

BRIEF SUMMARY OF THE INVENTION

The present invention is based on the findings of the present inventors. The means for solving aforesaid problems are described in attached claims.

The resist pattern thickening material of the present invention contains at least a resin and a compound represented by the following General Formula (1), is a nonaqueous material, and contains no acid-generator and no crosslinker.

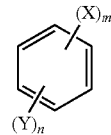

General Formula (1)

In the General Formula (1), "X" represents a functional group represented by the following Structural Formula (1); "Y" represents at least any one of a hydroxyl group, an amino group, an alkyl group-substituted amino group, an alkoxy group, an alkoxycarbonyl group, and an alkyl group, and the number of substituents in an amino group substituted by alkyl groups is an integer of 1 or 2; "m" is an integer of 1 or more; and "n" is an integer of 0 or more.

Structural Formula (1)

In the Structural Formula (1), "$R^1$" and "$R^2$" may be same to each other or different from each other and respectively represent a hydrogen atom or a substituent group; "Z" represents at least any one of a hydroxyl group, an amino group, an alkyl group-substituted amino group, and an alkoxy group, and the number of substituents in an amino group substituted by alkyl groups is an integer of 1 or 2.

After the resist pattern thickening material is applied over the surface of a resist pattern, the resist pattern thickening material residing near the interface with the resist pattern infiltrates into the resist pattern to interact with or be mixed with the material of the resist pattern, and the compound represented by the General Formula (1) reacts to the resin residing near the compound. At this point in time, a surface layer or a mixing layer which is formed as a result of an interaction between the resist pattern thickening material and the resist pattern can be efficiently formed on the surface of the resist pattern in a state where the resist pattern constitutes the innerlayer thereof because of excellent affinity between the resist pattern thickening material and the resist pattern. As the result, the resist pattern can be efficiently thickened with the resist pattern thickening material. The thus thickened (hereinafter, may be referred to as "swelled") resist pattern (hereinafter, may be referred to as "thickened resist pattern") is uniformly thickened with the resist pattern thickening material. For this reason, a space pattern of resist (hereinafter, may be sometimes referred to as "space pattern") to be formed with the thickened resist pattern has a fine structure, exceeding the exposure limit (resolution limit) of light source of an available exposure device. Since the resist pattern thickening material of the present invention contains a compound represented by the General Formula (1), the resist pattern thickening material can exhibit an effect of thickening a resist pattern efficiently and uniformly, irrespective of the type and the size of a material used for the resist pattern and has less dependency on the type and the size of the material used for the resist pattern. When a phenol resin, polyvinylpyrolidone, and the like are used as the resin, the resist pattern is excellent particularly in etch resistance because the resin and the compound represented by the General Formula (1) respectively have an aromatic ring. For this reason, the resist pattern thickening material of the present invention can also be preferably used in forming a resist pattern such as a lines & spaces pattern on an interconnection layer of a LOGIC LSI in which various sizes of thickened resist patterns are utilized.

The method for forming a resist pattern of the present invention includes at least forming a resist pattern on a surface of a workpiece to be processed and applying a resist pattern thickening material over the surface of the workpiece so as to cover the surface of the resist pattern.

In the method for forming a resist pattern of the present invention, after a resist pattern is formed and the resist pattern thickening material is applied over the surface of the resist pattern, the resist pattern thickening material residing near the interface with the resist pattern infiltrates into the resist pattern to interact with or be mixed with the material of the resist pattern, and the compound represented by the following General Formula (1) reacts to the resin residing near the compound. For this reason, a surface layer or a mixing layer formed as a result of an interaction between the resist pattern thickening material and the resist pattern is efficiently formed on the surface of the resist pattern in a state where the resist pattern constitutes the innerlayer thereof. The thus thickened resist pattern is uniformly thickened with the resist pattern thickening material. Therefore, a space pattern of resist formed with the thickened resist pattern has a fine structure, exceeding the exposure limit (resolution limit) of light sources of an available exposure device. Since the resist pattern thickening material of the present invention contains a compound represented by the General Formula (1), the resist pattern thickening material can exhibit an effect of thickening the resist pattern efficiently and uniformly, irrespective of the type and the size of a material used for the resist pattern and has less dependency on the type and the size of the material used for the resist pattern. When a phenol resin, polyvinylpyrolidone, and the like are used as the resin, the resist pattern is excellent particularly in etch resistance because the resin and the compound represented by the General Formula (1) respectively have an aromatic ring. For this reason, the resist pattern thickening material of the present invention can also be preferably used in forming resist patterns such as a lines & spaces pattern on an interconnection layer of a LOGIC LSI where not only a contact hole pattern but also various sizes of thickened resist patterns are utilized.

The method for manufacturing a semiconductor device of the present invention includes forming, on a surface of a workpiece to be processed, a resist pattern; applying the resist pattern thickening material of the present invention over the surface of the workpiece so as to cover the surface of the resist pattern to thereby thicken the resist pattern; and etching the surface of the workpiece using the thickened resist pattern as a mask so as to pattern the surface of the workpiece.

In the method for manufacturing a semiconductor device of the present invention, in the forming of a resist pattern, a resist pattern is formed on a surface of a workpiece to which a pattern such as an interconnection pattern is to be formed, and the above-noted resist pattern thickening material is applied so as to cover the surface of the resist pattern. Then, the resist pattern thickening material residing near the interface with the resist pattern infiltrates into the resist pattern to interact with or be mixed with the material of the resist pattern, and the compound represented by the General Formula (1) reacts to the resin residing near the compound. Then, a surface layer or a mixing layer formed as a result of an interaction between the resist pattern thickening material and the resist pattern can be efficiently formed on the surface of the resist pattern in a state where the resist pattern constitutes the innerlayer thereof. The thus thickened resist pattern is uniformly thickened with the resist pattern thickening material. For this reason, a space pattern of resist formed with the thickened resist pattern has a fine structure, exceeding the exposure limit (resolution limit) of light sources of an available exposure device. Since the resist pattern thickening material of the present invention contains a compound represented by the General Formula (1), the resist pattern thickening material can exhibit an effect of thickening the resist pattern efficiently and uniformly, irrespective of the type and the size of a material used for the resist pattern and has less dependency on the type and the size of the material used for the resist pattern. When a phenol resin, polyvinylpyrolidone and the like are used as the resin, the resist pattern is excellent particularly in etch resistance because the resin and the compound represented by the General Formula (1) respectively have an aromatic ring. Therefore, with the use of the resist pattern thickening material of the present invention, it is possible to easily and precisely form a thickened resist pattern such as a lines & spaces pattern on an interconnection layer of a LOGIC LSI where not only a contact hole pattern but also various sizes of thickened resist patterns are utilized.

Subsequently, in the patterning of the thickened resist pattern, by etching the surface of the workpiece using the thickened resist pattern which has been thickened in the forming of the resist pattern, the surface of the workpiece can be patterned finely and precisely with accurate dimension, thus high quality and high performance semiconductor devices each having a pattern such as an extremely fine and precise interconnection pattern with excellent accurate dimension can be manufactured efficiently.

The semiconductor device of the present invention is manufactured by the method for manufacturing a semiconductor device of the present invention. The semiconductor device has patterns, for example, interconnection patterns, with fine, precise and accurate dimension, and is of high quality and of high performance.

DETAILED DESCRIPTION OF THE INVENTION

Resist Pattern Thickening Material

Figure 1:
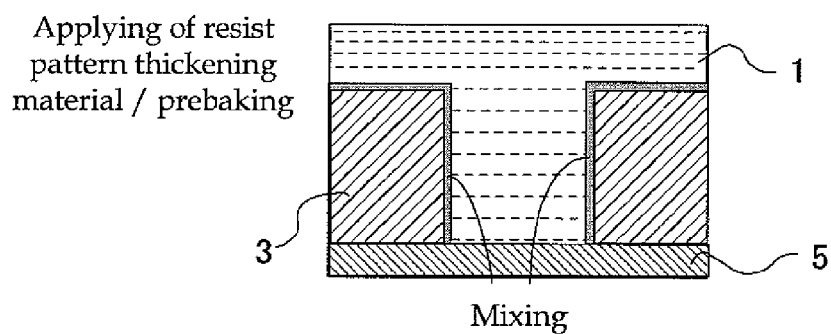
FIG. 1 is a schematic diagram for explaining one example of the mechanism of thickening a resist pattern by using a resist pattern thickening material of the present invention, and showing the state where the resist pattern thickening material is applied over the surface of the resist pattern.

The resist pattern thickening material of the present invention contains at least a resin and a compound represented by the following General Formula (1) and further contains a surfactant, an organic solvent, and other components suitably selected in accordance with the intended use, and the resist pattern thickening material is a nonaqueous material and contains no acid-generator and no crosslinker.

General Formula (1)

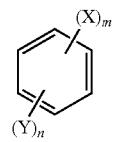

In the General Formula (1), "X" represents a functional group represented by the following Structural Formula (1); "Y" represents at least any one of a hydroxyl group, an amino group, an alkyl group-substituted amino group, an alkoxy group, an alkoxycarbonyl group, and an alkyl group, and the number of substituents in an amino group substituted by alkyl groups is an integer of 1 or 2; "m" is an integer of 1 or more; and "n" is an integer of 0 or more.

Structural Formula (1)

In the Structural Formula (1), "$R^1$" and "$R^2$" may be same to each other or different from each other and respectively represent a hydrogen atom or a substituent group; "Z" represents at least any one of a hydroxyl group, an amino group, an alkyl group-substituted amino group, and an alkoxy group, and the number of substituents in an amino group substituted by alkyl groups is an integer of 1 or 2.

The resist pattern thickening material of the present invention is a nonaqueous material. Here, the "nonaqueous material" means a material that contains no water, and the nonaqueous material preferably contains any one of the organic solvents which will be described below.

It is necessary that the resist pattern thickening material of the present invention contains no acid generator and no crosslinker. The technique of thickening of a resist pattern using the resist pattern thickening material differs from a conventional technique of swelling of a resist pattern utilizing a crosslinking reaction based on acid diffusion.

The resist pattern thickening material of the present invention is preferably water-soluble or alkali-soluble. When the resist pattern thickening material is water-soluble or alkali-soluble, the resist pattern thickening material can be rinsed with water or an alkaline developer to remove unreacted portions and allows for sharing one resist-developing cup without the necessity of setting up a new process line for a new chemical agent for developing when forming a resist pattern to thereby reduce device cost.

The water-solubility of the resist pattern thickening material is not particularly limited as long as it has such a solubility that unreacted portions can be removed, and may be suitably adjusted in accordance with the intended use, however, a solubility that 0.1 g or more of the resist pattern thickening material can be dissolved in 100 g of 25° C. water is preferable, for example.

The alkali-solubility of the resist pattern thickening material is not particularly limited and may be suitably selected in accordance with the intended use, however, an alkali-solubility that 0.1 g or more of the resist pattern thickening material can be dissolved in 100 g of 25° C. and 2.38% by mass of a tetramethylammonium hydroxide (TMAH) aqueous solution is preferable, for example.

An embodiment of the resist pattern thickening material of the present invention may be an organic solution, a colloidal dispersion, an emulsion dispersion or the like. It is particularly preferable that the resist pattern thickening material of the present invention is an organic solution.

—Resin—

The resin is not particularly limited and may be suitably selected in accordance with the intended use, however, the resin preferably has a cyclic structure in at least part of its structure from the perspective that it can impart excellent etch resistance to the resist pattern thickening material. As a preferred example of the resin containing a cyclic structure, at least one selected from phenol resins, polyvinylpyrolidone, styrene-maleic acid copolymers, alkyl resins, and mixtures thereof is exemplified.

The phenol resin is not particularly limited and may be suitably selected in accordance with the intended use, however, preferred examples thereof include polyparahydroxystyrene resins, and novolac resins.

Each of these resins may be used alone or in combination with two or more. Of these, polyparahydroxystyrene resins, novolac resins, polyvinylpyrolidones are preferable.

The content of the resin in the resist pattern thickening material can be suitably determined in accordance with the type and the content of the compound represented by the following General Formula (1), a surfactant, an organic solvent and the like which will be described below.

—Compound Represented by General Formula (1)—

The compound represented by the General Formula (1) is not particularly limited and may be suitably selected in accordance with the intended use as long as the compound has an aromatic ring in part of its structure and is represented by the following General Formula (1). It is advantageous to use such a compound having the aromatic ring from the perspective that it can impart excellent etch resistance to the resist pattern thickening material.

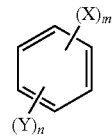

General Formula (1)

In the General Formula (1), "X" represents a functional group represented by the following Structural Formula (1); "Y" represents at least any one of a hydroxyl group, an amino group, an alkyl group-substituted amino group, an alkoxy group, an alkoxycarbonyl group, and an alkyl group, and the number of substituents in an amino group substituted by alkyl groups is an integer of 1 or 2; "m" is an integer of 1 or more; and "n" is an integer of 0 or more. The "m" is preferably an integer of 1 from the perspective of preventability of occurrences of crosslinking reaction and easily controlling reactions.

Structural Formula (1)

In the Structural Formula (1), "$R^1$" and "$R^2$" may be same to each other or different from each other and respectively represent a hydrogen atom or a substituent group; "Z" represents at least any one of a hydroxyl group, an amino group, an alkyl group-substituted amino group, and an alkoxy group, and the number of substituents in an amino group substituted by alkyl groups is an integer of 1 or 2.

In the Structural Formula (1), preferably, "$R^1$" and "$R^2$" respectively represent a hydrogen atom. When "$R^1$" and "$R^2$" are respectively a hydrogen atom, there are many advantages in water-solubility.

In the Structural Formula (1), when "$R^1$" and "$R^2$" are respectively the substituent group, the substituent group is not particularly limited, may be suitably selected in accordance with the intended use, and examples thereof include ketone (alkylcarbonyl) groups, alkoxycarbonyl groups, and alkyl groups.

As specific examples of a compound represented by the General Formula (1), compounds each having a benzyl alcohol structure, and compounds each having a benzyl amine structure are preferably exemplified.

The compound having a benzyl alcohol structure is not particularly limited and may be suitably selected in accordance with the intended use. For example, benzyl alcohols, and derivatives thereof are preferable. Specific examples thereof include benzyl alcohol, 2-hydroxybenzyl alcohol (salicyl alcohol), 4-hydroxybenzyl alcohol (salicyl alcohol), 4-hydroxybenzyl alcohol, 2-aminobenzyl alcohol, 4-aminobenzyl alcohol, 2,4-dihydroxybenzyl alcohol, 1,4-benzenedimethanol, 1,3-benzenedimethanol, 1-phenyl-1,2-ethanediol, and 4-methoxymethylphenol.

The compound having a benzylamine structure is not particularly limited and may be suitably selected in accordance with the intended use. For example, benzylamine and derivatives thereof are preferable. Specifically, benzylamine, 2-hydroxybenzylamine, and 2-methoxybenzylamine are exemplified.

Each of these compounds may be used alone or in combination with two or more.

The content of the compound represented by the General Formula (1) in the resist pattern thickening material is not particularly limited and may be suitably adjusted in accordance with the intended use. For example, the content of the compound represented by the General Formula (1) is preferably 0.01 parts by mass to 50 parts by mass relative to the total content of the resist pattern thickening material, and more preferably 0.1 parts by mass to 10 parts by mass.

When the content of the compound represented by the General Formula (1) is less than 0.01 parts by mass, a desired reaction amount may not be easily obtained. When the content of the compound represented by the General Formula (1) is more than 50 parts by mass, it is unfavorable because there is a high possibility that the compound precipitates when the resist pattern thickening material is applied and then pattern defects occur.

—Surfactant—

When the blendability between the resist pattern thickening material and a resist pattern is required to improve, when a greater amount of the thickening is required, when the in-plane uniformity of thickening effect is required to improve in the interface between the resist pattern thickening material and a resist pattern, when defoamability is required or the like, an addition of the surfactant makes it possible to meet these demands.

The surfactant is not particularly limited and may be suitably selected in accordance with the intended use. Examples of the surfactant include nonionic surfactants, cationic surfactants, anionic surfactants, and amphoteric surfactants. Each of these surfactants may be used alone or in combination with two or more. Of these, nonionic surfactants are preferable from the perspective that metal ions such as sodium salt and potassium salt are not contained therein.

For the nonionic surfactant, a nonionic surfactant may be preferably selected from alkoxylate surfactants, fatty acid ester surfactants, amide surfactants, alcohol surfactants, ethylenediamine surfactants, and silicone surfactants. Specifically, preferred examples thereof include polyoxyethylene-polyoxypropylene condensation compounds, polyoxyalkylene alkyl ether compounds, polyoxyethylene alkyl ether compounds, polyoxyethylene derivative compounds, sorbitan fatty acid ester compounds, glycerine fatty acid ester compounds, primary alcohol ethoxylate compounds, phenol ethoxylate compounds, nonylphenol ethoxylate compounds, octylphenol ethoxylate compounds, lauryl alcohol ethoxylate compounds, oleyl alcohol ethoxylate compounds, fatty acid ester surfactants, amide surfactants, natural alcohol surfactants, ethylene diamine surfactants, and secondary alcohol ethoxylate surfactants.

The cationic surfactant is not particularly limited and may be suitably selected in accordance with the intended use. Preferred examples thereof include alkyl cationic surfactants, amide-type quaternary cationic surfactants, and ester-type quaternary cationic surfactants.

The amphoteric surfactant is not particularly limited and may be suitably selected in accordance with the intended use. Examples thereof include amine oxide surfactants, and betaine surfactants.

The content of the surfactant in the resist pattern thickening material is not particularly limited and may be suitably adjusted in accordance with the type and the content of the resin and the compound represented by the General Formula (1). For example, the content of the surfactant is preferably 0.005 parts by mass relative to 100 parts by mass of the resist pattern thickening material, more preferably 0.05 parts by mass or more to 2 parts by mass from the perspective of the reaction amount and from the perspective that the resist pattern thickening material is excellent in in-plane uniformity, and still more preferably 0.08 parts by mass to 0.25 parts by mass.

When the content of the surfactant is less than 0.005 parts by mass, the reaction amount of the resist pattern thickening material with a resist pattern does not make much difference as compared to the case where the resist pattern thickening material contains no surfactant, although it is effective in enhancement of coating properties.

—Organic Solvent—

The organic solvent is not particularly limited as long as it does not substantially dissolve the resist pattern, and may be suitably selected in accordance with the intended use. For example, an alcohol solvent having 4 or more carbon atoms and a glycol solvent having 2 or more carbon atoms are preferably exemplified.

When the resist pattern thickening material contains the organic solvent, it is advantageous in that the solubility of the resin with the compound represented by the General Formula (1) in the resist pattern thickening material can be improved.

The alcohol solvent having 4 or more carbon atoms is not particularly limited and may be suitably selected in accordance with the intended use, however, the number of carbon atoms of the alcohol solvent is preferably 4 to 5. Preferred examples thereof include isobutanol, n-butanol, and 4-methyl-2-pentanol.

The glycol solvent having 2 or more carbon atoms is not particularly limited and may be suitably selected in accordance with the intended use, however, the number of carbon atoms of the glycol solvent is preferably 2 to 3. Preferred examples thereof include ethylene glycol, and propylene glycol.

Each of these organic solvents may be used alone or in combination with two or more. Of these, an organic solvent having a boiling point of around 80° C. to 200° C. is preferable in terms that it can prevent rapid drying of the resist pattern thickening material when applied, and the resist pattern thickening material can be efficiently applied with the use of such an organic solvent.

The content of the organic solvent in the resist pattern thickening material can be suitably determined in accordance with the type and the content of the resin, the compound represented by the General Formula (1), and the surfactant and the like.

—Other Components—

The other components are not particularly limited as long as they do not impair the effects of the resist pattern thickening material of the present invention, and may be suitably selected in accordance with the intended use. Examples of the other components include various additives known in the art such as thermal oxidation generators, quenchers typified by amine quencher, and amide quencher.

The content of the other components in the resist pattern thickening material can be suitably determined in accordance with the type and the content of the resin, the compound represented by the General Formula (1), and the surfactant and the like.

—Usage of Resist Pattern Thickening Material—

The resist pattern thickening material of the present invention can be applied over the surface of the resist pattern for use.

The surfactant may be separately applied over the surface of the resist pattern before the resist pattern thickening material is applied over the surface of the resist pattern, without containing the surfactant in the resist pattern thickening material.

When the resist pattern thickening material is applied over the surface of the resist pattern, the resist pattern thickening material interacts with or is mixed with the resist pattern, and the compound represented by the General Formula (1) reacts to the resin residing near the compound to thereby form a layer or a mixing layer formed as a result of an interaction between the resist pattern thickening material interacts and the resist pattern, on the surface of the resist pattern. As the result, the thickened resist pattern is thicker than the resist pattern to be thickened i.e. the unthickened resist pattern, by an amount corresponding to the thickness of the mixing layer, and a thickened resist pattern is formed.

When the compound represented by the General Formula (1) is contained in the resist pattern thickening material, it makes it possible to obtain the effect of efficiently and uniformly thickening a resist pattern, irrespective of the type, the size, or the like of material of the resist pattern, and the thickened amount has less dependency on the material and the size of the resist pattern.

The diameter and the width of the space pattern of resist formed from the thus thickened resist pattern are smaller than those of the space pattern of resist that has been formed from the unthickened resist pattern. As the result, a fine space pattern of resist can be formed, exceeding the exposure or resolution limit of a light source of the exposure device used in patterning of the resist pattern, namely, with lower values than the threshold limits of opening diameter or patterning intervals allowing for patterning with the wavelength of light used for the light source. In other words, when a resist pattern is obtained by means of ArF excimer laser light, during the patterning of a resist pattern, is thickened with the resist pattern thickening material, the space pattern of resist formed from the thickened resist pattern can represent such fine conditions as those patterned by use of an electron beam.

The thickened amount of the resist pattern can be controlled within a desired range by appropriately controlling the viscosity, coating thickness of the resist pattern thickening material, temperature of baking, baking time, or the like.

—Material of Resist Pattern—

Material of the resist pattern or a resist pattern to be coated with the resist pattern thickening material of the present invention is not particularly limited and may be suitably selected in accordance with the intended use. For example the material of the resist pattern may be of negative polarity or positive polarity. Preferred examples thereof include g-ray resists, i-ray resists, KrF resists, ArF resists, $F_2$ resists, and electron beam resists etc. that can be respectively patterned with a g-ray, an i-ray, a KrF excimer laser, an ArF excimer laser, an $F_2$ excimer laser, an electron beam or the like. Each of these resists may be a chemically-amplified resist or a non-chemically amplified resist. Of these, a KrF resist, an ArF resist, and a resist containing an acrylic resin are preferable. From the perspective of fine patterning and improvements of throughput, at least any one of an ArF resist which is desired to extend the exposure limit thereof and a resist containing an acrylic resin are more preferable.

Specific examples of the material of the resist pattern include an acrylic resist having an adamantyl group at side chains thereof a cycloolefin-maleic anhydride (COMA) resist, a cycloolefin resist, and hybrid (cycloaliphatic acrylic-COMA copolymer) resist. Each of these materials may be fluorine-modified.

The method of forming the resist pattern, the size and the thickness of the resist pattern are not particularly limited and may be suitably selected in accordance with the intended use. The thickness of the resist pattern can be suitably determined based on a surface of a workpiece to be processed, and etching conditions. Typically, the thickness of the resist pattern is about 0.2 µm to 700 µm.

The thickening of the resist pattern using the resist pattern thickening material will be hereinafter explained with reference to drawings.

Figure 2:
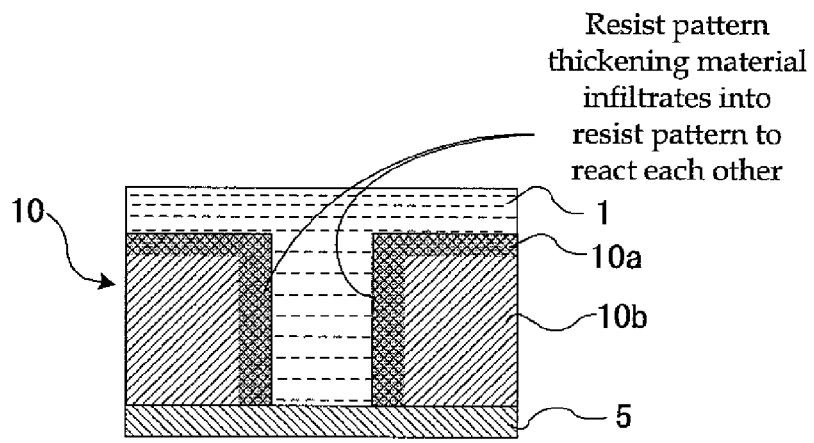
FIG. 2 is a schematic diagram for explaining one example of the mechanism of thickening a resist pattern by using a resist pattern thickening material of the present invention, and showing the state where the resist pattern thickening material infiltrates into the surface of the resist pattern.

As shown in FIG. 1, after a resist pattern 3 is formed on a surface of a workpiece (base) 5, a resist pattern thickening material 1 is applied over the surface of the resist pattern 3, and the applied resist pattern thickening material is baked (heated and dried) to thereby form a coated film. Then, a mixing or infiltrating of the resist pattern thickening material 1 into the resist pattern 3 takes place at the interface between the resist pattern 3 and the resist pattern thickening material 1, and the compound represented by the General Formula (1) in the resist pattern thickening material 1 reacts with the resin residing near the compound. Then, as shown in FIG. 2, a surface layer or mixing layer 10a is formed as the result of reaction of the mixed or infiltrated portions at the interface of an inner layer resist pattern 10b (the resist pattern 3) and the resist pattern thickening material 1. At this time, the inner layer resist pattern 10b (the resist pattern 3) can be stably and uniformly thickened without depending on the size of the inner layer resist pattern 10b (the resist pattern 3) because the compound represented by the General Formula (1) is contained in the resist pattern thickening material 1.

Figure 3:
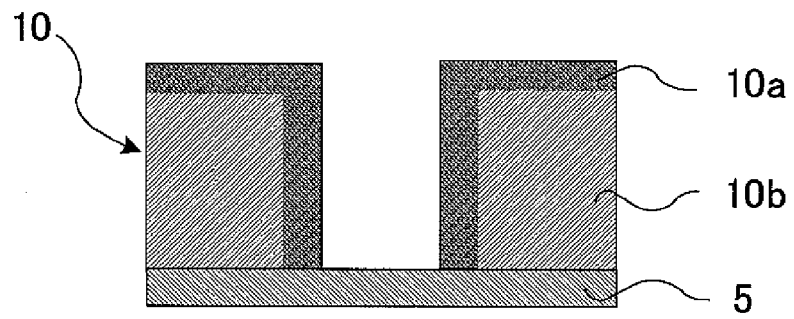
FIG. 3 is a schematic diagram for explaining one example of the mechanism of thickening a resist pattern by using a resist pattern thickening material of the present invention, and showing the state where the surface of the resist pattern is thickened with the resist pattern thickening material.

Subsequently, as shown in FIG. 3, by rinsing the resist pattern 3, the portions with no interaction or mixing with the resist pattern 3 or portions with less interaction or mixing with the resist pattern 3, i.e., the portions having high alkali-solubility, in the resist pattern thickening material 1 applied over the surface of the resist pattern 3, are dissolved and removed, and therefore a thickened resist pattern 10 which has been uniformly thickened is developed or formed.

The resist pattern 3 may be rinsed by use of water or an alkaline developer.

The thickened resist pattern 10 has, on the surface of the inner layer resist pattern 10b (the resist pattern 3), the surface layer 10a (mixing layer) which has been formed as the result of reaction of the resist pattern thickening material 1 with the resist pattern 3. Since the thickened resist pattern 10 is thicker than the resist pattern 3 by an amount corresponding to the thickness of the surface layer 10a, the size of a space pattern formed using the thickened resist pattern 10 i.e. the distance between adjacent elements of the thickened resist pattern 10 or opening diameter of the hole pattern formed from the thickened resist pattern 10, is smaller than that formed from the unthickened resist pattern 3. Thus, the space pattern of resist can be formed finely, exceeding exposure or resolution limits of a light source of the exposure device used in forming the resist pattern 3. Namely, when a resist pattern is patterned by means of ArF excimer laser light as an exposure light and is thickened with the resist pattern thickening material, the space pattern formed from the thickened resist pattern 10 can represent such fine conditions as those patterned by use of an electron beam. The space pattern formed from the thickened resist pattern 10 is finer and more precise than the space pattern formed from the resist pattern 3.

The surface layer 10a (mixing layer) in the thickened resist pattern 10 is formed from the resist pattern thickening material 1. The obtained thickened resist pattern 10 is excellent in etch resistance even when the resist pattern 3 (the inner layer resist pattern 10b) is formed from a material which has low etch resistance, since the compound represented by the General Formula (1) in the resist pattern thickening material 1 has an aromatic ring. When the resin in the resist pattern thickening material 1 is the phenol resin containing a cyclic structure, the etch resistance of the obtained thickened resist pattern 10 is further improved.

The resist pattern thickening material of the present invention can be preferably used for thickening a resist pattern and finely forming a space pattern of resist exceeding exposure limits (resolution limits) of light sources of available exposure devices. The resist pattern thickening material of the present invention can be preferably used particularly in the method for forming a resist pattern of the present invention and the method for manufacturing a semiconductor device of the present invention.

Since the compound represented by the General Formula (1) in the resist pattern thickening material of the present invention has an aromatic ring, the resist pattern thickening material of the present invention can be preferably used for coating and thickening of a resist pattern formed from a resin or the like that needs to improve the surface etch resistance thereof because the surface of the resist pattern is to be exposed to a plasma. Further, when the resin in the resist pattern thickening material of the present invention is the phenol resin containing a cyclic structure, the resist pattern thickening material of the present invention can be preferably used for coating or thickening the resist pattern.

With the use of the resist pattern thickening material of the present invention, for example, when a resist pattern is pretreated with an alkaline aqueous solution having a pH of 10 or more before the pretreatment with the resist pattern thickening material of the present invention and then the resist pattern is thickened with the resist pattern thickening material, and also when the resist pattern thickening material of the present invention is used for a resist pattern that has been left under any normal circumstance other than a clean room for one year after exposure of the resist pattern, it is possible to thicken the resist pattern with the resist pattern thickening material on the same level as the case of not performing the treatment mentioned above. Even when the resist pattern thickening material of the present invention is used for a resist pattern formed by electron beam exposure using a non-chemically amplified resist containing no acid and no acid generator, for example, using a non-chemically amplified resist composed of polymethyl methacrylate, the non-chemically amplified resist can be thickened on the same level as a chemically amplified resist. From these facts, it is easily understandable that the present invention uses a reaction pattern which differs from conventional swelling techniques utilizing a crosslinking reaction caused by acid diffusion. It can be also presumed that when the resist pattern thickening material of the present invention is used, the thickening of the resist pattern can be achieved depending on the solubility of the resin used in the mixing layer which is formed from the resist pattern and the resist pattern thickening material.

(Method for Forming Resist Pattern)

The method for forming a resist pattern of the present invention includes at least forming a resist pattern on a surface of a workpiece to be processed and applying a resist pattern thickening material over the surface of the workpiece so as to cover the surface of the resist pattern, and further includes other treatments suitably selected in accordance with the necessity.

For material of the resist pattern, the materials of the resist pattern thickening material of the presented invention set forth above are preferably exemplified.

The resist pattern can be formed following a conventional method.

The resist pattern can be formed on a surface of a workpiece (base). The surface of the workpiece (base) is not particularly limited, and may be suitably selected in accordance with the intended use. However, when the resist pattern is formed in a semiconductor device, the surface of the workpiece (base) is preferably, for example, a surface of a semiconductor substrate. Specific examples thereof include surfaces of substrates such as silicon wafers, and various types of oxide films.

The method of applying the resist pattern thickening material is not particularly limited and may be suitably selected from among known coating methods in accordance with the intended use. Preferred examples thereof include a spin coating method. When a spin coating method is used, the conditions are as follows, for example, the rotation speed is typically around 100 rpm to 10,000 rpm, and preferably 800 rpm to 5,000 rpm, and the rotation time is around 1 second to 10 minutes, and is preferably 1 second to 90 seconds.

The coated thickness of a resist pattern with the resist pattern thickening material is usually around 10 nm to 1,000 nm (100 angstroms to 10,000 angstroms), and preferably 100 nm to 500 nm (1,000 angstroms to 5,000 angstroms).

Note that the surfactant may be separately applied over the surface of the resist pattern before the resist pattern thickening material is applied over the surface of the resist pattern, without containing the surfactant in the resist pattern thickening material.

When the resist pattern thickening material is applied or thereafter, it is preferable to heat and dry (prebake) the applied resist pattern thickening material. When the applied resist pattern thickening material is prebaked, the resist pattern thickening material can be efficiently mixed with or infiltrated into the resist pattern at the interface between the resist pattern and the resist pattern thickening material.

The prebaking (heating and drying) conditions and the method of prebaking the applied resist pattern thickening material are not particularly limited as long as they do not soften the resist pattern, and may be suitably selected in accordance with the intended use. The applied resist pattern thickening material may be prebaked once or two or more times. When the applied resist pattern thickening material is prebaked two or more times, the prebaking temperature in each of two or more prebaking times may be held constant or may be held differently from each other. When the prebaking temperature is held constant, the prebaking temperature is preferably 40° C. to 150° C., and more preferably 70° C. to 120° C. The applied resist pattern thickening material is preferably prebaked for about 10 seconds to 5 minutes and is more preferably prebaked for 40 seconds to 100 seconds.

After prebaking (heating and drying) the applied resist pattern thickening material, in accordance with the necessity, it is also preferable that the applied resist pattern thickening material is further heated to accelerate the reaction of the applied resist pattern thickening material (reaction baking) from the perspective that the reaction of the mixed or infiltrated portions can be efficiently progressed at the interface between the resist pattern and the resist pattern thickening material.

The reaction baking conditions and the method for reaction baking are not particularly limited and may be suitably selected in accordance with the intended use, however, a higher temperature condition than the prebaking (heating and drying) temperature is typically employed. For the reaction baking conditions, the temperature is around 70° C. to 150° C. and more preferably 90° C. to 130° C. The applied resist pattern thickening material is reaction-baked for 10 seconds to 5 minutes and more preferably 40 seconds to 100 seconds.

Further, it is preferable to rinse the applied resist pattern thickening material i.e. to remove unreacted portions after the reaction baking. In this case, when the applied resist pattern thickening material is rinsed after the heating, it is preferable in that the portions with no interaction or mixing with the resist pattern, or the portions with less interaction or mixing with the resist pattern, i.e., the portions having high alkali-solubility, in the applied resist pattern thickening material, are dissolved and removed to thereby rinse and obtain a thickened resist pattern.

A solution used for the developing treatment is not particularly limited and may be suitably selected in accordance with the intended use, however, an alkali developer and water (pure water) are preferably exemplified. Each of these developers may be used alone or in combination with two or more. In the developing treatment, it is unnecessary to set up a new process line for a new chemical agent, and one resist-developing cup can be shared. Therefore, the device cost can be reduced.

For the alkali developer, 2.38% by mass of a tetramethyl ammonium hydroxide (TMAH) aqueous solution is preferably exemplified.

The method for forming a resist pattern of the present invention will be described hereinafter with reference to the drawings.

Figure 4:
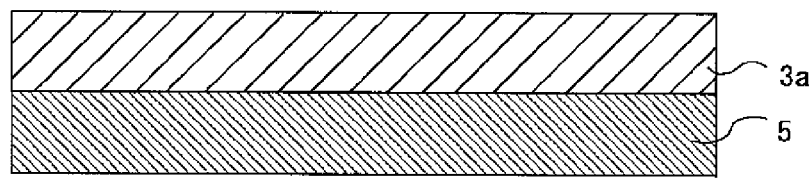
FIG. 4 is a schematic diagram for explaining an example of the method for forming a resist pattern of the present invention, and showing the state where a resist film is formed.
Figure 5:
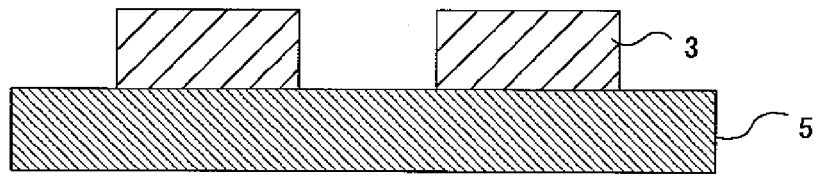
FIG. 5 is a schematic diagram for explaining an example of the method for forming a resist pattern of the present invention, and showing the state where the resist film is subjected to patterning, thereby forming a resist pattern.
Figure 6:
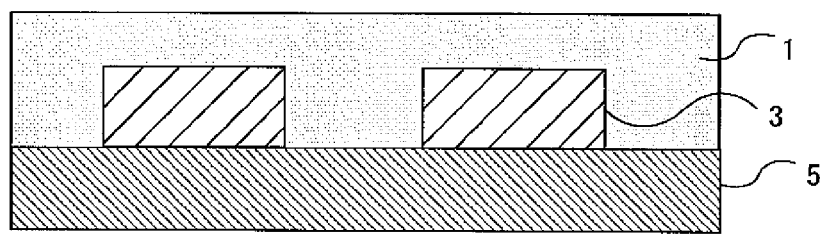
FIG. 6 is a schematic diagram for explaining an example of the method for forming a resist pattern of the present invention, and showing the state where the resist pattern thickening material is applied over the surface of the resist pattern.
Figure 7:
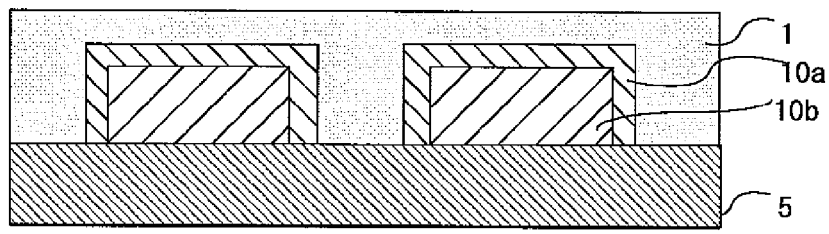
FIG. 7 is a schematic diagram for explaining an example of the method for forming a resist pattern of the present invention, and showing the state where a mixing occurred at the vicinity of the surface of the resist pattern and the resist pattern thickening material infiltrates into the resist pattern.
Figure 8:
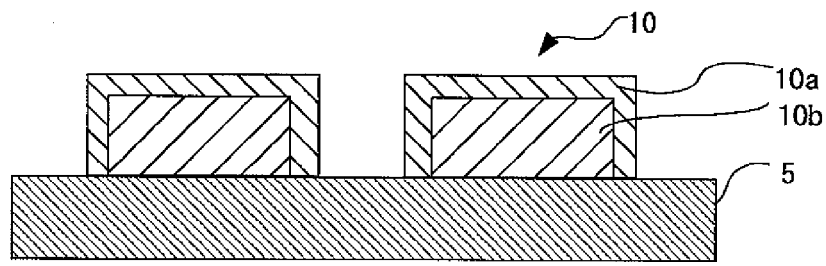
FIG. 8 is a schematic diagram for explaining an example of the method for forming a resist pattern of the present invention, and showing the state where the resist pattern thickening material is developed.

As shown in FIG. 4, a resist material 3a is applied over a surface of a workpiece (base) 5 to be processed. Then, as shown in FIG. 5, the resist film is patterned to form a resist pattern 3. Then, a resist pattern thickening material 1 is applied over the surface of the resist pattern 3, as shown in FIG. 6, and the resist film is pre-baked (heated and dried) to form a coated film. Then, interaction i.e. mixing or infiltrating of the resist pattern thickening material 1 into the resist pattern 3 takes place at the interface between the resist pattern 3 and the resist pattern thickening material 1. As shown in FIG. 7, mixed or infiltrated portions at the interface between the resist pattern 3 and the resist pattern thickening material 1 further interact or react to each other, and then the compound represented by the General Formula (1) in the resist pattern thickening material 1 reacts to the resin residing near the compound. Thereafter, as shown in FIG. 8, by subjecting the resist film to a rinsing treatment, the portions with no reaction or less interaction or mixing with the resist pattern 3, i.e. the portions having high alkali- or water-solubility, in the applied resist pattern thickening material 1, are dissolved and removed such that a thickened resist pattern 10 having a surface layer 10a on an inner layer resist pattern 10b (the resist pattern 3) can be developed or formed. Note that the resist pattern thickening material with no reaction or less interaction or mixing with the underlying resist pattern can be removed with water or an alkali developer.

The thickened resist pattern 10 is formed as a result of thickening of the resist pattern 3 by use of the resist pattern thickening material 1, and has, on the surface of the inner layer resist pattern 10b (the resist pattern 3), the surface layer 10a formed as a result of reaction of the resist pattern thickening material 1. Since the resist pattern thickening material 1 contains the compound represented by the General Formula (1), the thickened resist pattern 10 can be efficiently and uniformly thickened irrespective of the size and the type of material of the resist pattern 3. The thickened resist pattern 10 is thicker than the resist pattern 3 (the inner layer resist pattern 10b) by an amount corresponding to the thickness of the surface layer 10a. Thus, the width of the space pattern i.e. the distance between adjacent elements of the resist pattern, formed from the thickened resist pattern 10 is narrower than that of the space pattern formed from the resist pattern 3 (the inner layer resist pattern 10b), and the space pattern formed from the thickened resist pattern 10 is fine.

Since the surface layer 10a of the thickened resist pattern 10 is formed from the resist pattern thickening material 1, and the resist pattern thickening material 1 contains the compound represented by the General Formula (1) having an aromatic ring, it is possible to form the thickened resist pattern 10 having the surface layer (mixing layer) 10a, on the surface thereof, which is excellent in etch resistance, even when the resist pattern 3 (the inner layer resist pattern 10b) is formed from a material which has low etch resistance. When the resin in the resist pattern thickening material 1 is the phenol resin containing a cyclic structure, the etch resistance of the surface layer (mixing layer) is further improved.

A resist pattern which is formed by the method for forming a resist pattern of the present invention (hereinafter may be sometimes referred to as "thickened resist pattern") has, on the surface of the resist pattern, a surface layer which is formed as a result of an interaction or mixing between the resist pattern and the resist pattern thickening material. Since the resist pattern thickening material contains a compound represented by the General Formula (1) having an aromatic ring, it is possible to efficiently form a thickened resist pattern having, on the surface thereof, a surface layer (mixing layer) which is excellent in etch resistance, even when the resist pattern is formed from a material having low etch resistance. When the resin in the resist pattern thickening material is the phenol resin containing a cyclic structure, the etch resistance of the surface layer can be further improved. Further, since the thickened resist pattern formed by the method for forming a resist pattern of the present invention is thicker than the unthickened resist pattern by an amount corresponding to the thickness of the surface layer or mixing layer, the size such as diameter and width of the space pattern formed from thickened resist pattern 10 is smaller than that of a space pattern formed from the unthickened resist pattern. Thus, by using the method for forming a resist pattern of the present invention, a fine space pattern of resist can be formed efficiently.

The thickened resist pattern preferably has high etch resistance. It is preferable that the etching rate (nm/min) of the thickened resist pattern is equivalent to or less than that of the resist pattern. Specifically, the ratio of the etching rate (nm/min) of the resist pattern to the etching rate (nm/min) of the surface layer or mixing layer determined under the same condition, i.e. resist pattern/surface layer or mixing layer, determined under the same condition is preferably 1.1 or more, more preferably 1.2 or more, and particularly preferably 1.3 or more.

The etching rate (nm/min) can be determined, for example, by measuring the reduced amount of a sample film using a conventional etching system after etching for a predetermined time, and calculating the reduction per unit time.

The surface layer or mixing layer can be preferably formed by using the resist pattern thickening material of the present invention, and the surface layer or mixing layer preferably contain a cyclic structure such as the phenol resin from the perspective of further improvements in the etch resistance of the surface layer.

Whether or not the surface layer or mixing layer contains the cyclic structure can be checked by, for example, analyzing the IR absorption spectrum of the surface layer or mixing layer.

The method for forming a resist pattern of the present invention is preferably used for forming a variety of space patterns of resist, for example, lines & spaces patterns, hole patterns (e.g. for contact hole), trench (groove) patterns, and the like. A thickened resist pattern formed by the method for forming a resist pattern can be used, for example, as a mask pattern, reticle pattern and the like, and can be preferably used for manufacturing functional parts such as metal plugs, various interconnections, recording heads, LCDs (liquid crystal displays), PDPs (plasma display panels), SAW filters (surface acoustic wave filters); optical parts used in connecting optical wiring; fine parts such as microactuators; semiconductor devices; and the like, and can be preferably used in the method for manufacturing a semiconductor device of the present invention which will be described hereinafter.

(Semiconductor Device and Method for Manufacturing Semiconductor Device)

The method for manufacturing a semiconductor device of the present invention includes a resist pattern forming step and a patterning step, and further includes any other steps suitably selected in accordance with the necessity.

The semiconductor device of the present invention can be manufactured by the method for manufacturing a semiconductor device of the present invention.

The resist pattern forming step is a step for forming a resist pattern on a surface of a workpiece to be processed, and applying the resist pattern thickening material of the present invention over the surface of the workpiece so as to cover the surface of the resist pattern to thereby thicken the resist pattern. A thickened resist pattern can be formed on the surface of the workpiece to be processed by the resist pattern forming step.

The details of the resist pattern forming step are the same as those described in the method for forming a resist pattern of the present invention. The resist pattern forming step preferably includes applying the resist pattern thickening material over the surface of the formed resist pattern (resist film), and subjecting the applied resist pattern thickening material to a heating treatment and a rinsing treatment.

Note that examples of the surface of the workpiece to be processed include surface layers of various members in semiconductor devices. Preferred examples thereof are substrates such as silicon wafers, surface layers thereof, and various types of oxide films. The resist pattern to be thickened is as described above. The method of coating is also as described above. Preferred examples of material of the resist pattern include the ArF resist and resists containing the acrylic resin. The method of applying the resist pattern thickening material, the method of heating the applied resist pattern thickening material (prebaking method, and reaction baking method), and the rinsing treatment are as described above.

The patterning step is a step for patterning the surface of the workpiece by etching the surface of the workpiece using the thickened resist pattern formed by the resist pattern forming step as a mask or the like (as a mask pattern or the like).

The method of etching is not particularly limited and may be suitably selected from among known methods in the art in accordance with the intended use. For example, dry etching is preferably exemplified. The etching conditions are not particularly limited and may be suitably selected in accordance with the intended use.

Preferred examples of the other steps include a surfactant coating step, and a rinsing step.

The surfactant coating step is a step for applying the surfactant over the surface of the resist pattern before the resist pattern forming step.

The surfactant is not particularly limited, may be suitably selected in accordance with the intended use, and preferred examples thereof are the surfactants described above. Specific examples thereof include polyoxyethylene-polyoxypropylene condensation compounds, polyoxy alkylene alkyl ether compounds, polyoxy ethylene alkyl ether compounds, polyoxy ethylene derivative compounds, sorbitan fatty acid ester compounds, glycerine fatty acid ester compounds, primary alcohol ethoxylate compounds, phenol ethoxylate compounds, nonyl phenol ethoxylate compounds, octyl phenol ethoxylate compounds, lauryl alcohol ethoxylate compounds, oleyl alcohol ethoxylate compounds, fatty acid esters, amides, natural alcohols, ethylenediamine surfactants, secondary alcohol ethoxylate surfactants, alkyl cationic surfactants, amide quaternary cationic surfactants, ester quaternary cationic surfactants, amine oxide surfactants, betaine surfactants, and silicone surfactants.

By using the method for manufacturing a semiconductor device of the present invention, various conductor devices, typified by, for example, logic devices, flash memories, DRAMs, FRAMs can be efficiently manufactured.

EXAMPLES

Hereafter, the present invention will be further described in detail referring to specific Examples and Comparative Examples, however, the present invention is not limited to the disclosed Examples.

Example 1

Preparation of Resist Pattern Thickening Material

Resist pattern thickening materials A to O each having a composition shown in Table 1, each of which was a nonaqueous material and contained no acid generator and no crosslinker were prepared.

Note that "Thickened material" shown in Table 1 means a resist pattern thickening material, and the letters of "A" to "O" respectively correspond to the resist pattern thickening materials A to O. In the resist pattern thickening materials A to O, the resist pattern thickening material A corresponds to a material for Comparative Examples, and the resist pattern thickening materials B to O respectively correspond to materials for Examples of the present invention. The unit of values shown in parentheses in Table 1 is "part by mass" or "parts by mass".

In the column "Compound represented by General Formula (1)" for the resist pattern thickening materials B to O, "benzyl alcohol", "benzyl amine" and "the derivative thereof (a derivative of benzyl alcohol) (a derivative of benzyl amine)" are compounds represented by the following General Formula (1).

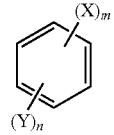

General Formula (1)

In the General Formula (1), "X" represents a functional group represented by the following Structural Formula (1); "Y" represents at least any one of a hydroxyl group, an amino group, an alkyl group-substituted amino group, an alkoxy group, an alkoxycarbonyl group, and an alkyl group, and the number of substituents in an amino group substituted by alkyl groups is an integer of 1 or 2; "m" is an integer of 1 or more; and "n" is an integer of 0 or more.

Structural Formula (1)

In the Structural Formula (1), "$R^1$" and "$R^2$" may be same to each other or different from each other and respectively represent a hydrogen atom or a substituent group; "Z" represents at least any one of a hydroxyl group, an amino group, an alkyl group-substituted amino group, and an alkoxy group, and the number of substituents in an amino group substituted by alkyl groups is an integer of 1 or 2.

In Table 1, "PHS" as shown in the column of "Resin" represents a polyparahydroxystyrene resin ("MARUKA LYNCUR", manufactured by Maruzen Petrochemical Co., Ltd.); "PVPd" represents a polyvinyl pyrolidone resin ("PVPd K 30", manufactured by KANTO CHEMICAL CO., INC.); "poly($HS_{90}$—$Pd_{10}$)" represents a hydroxystyrene-vinylpyrolidone copolymer (molecular mass=6,800) and the hydroxystyrene-vinylpyrolidone copolymer was synthesized by a polymerization reaction using AIBN (azobis-isobutylonitrile) as a radical initiator following a conventional method; and "novolac resin" is manufactured by ZEON CORPORATION.

In the column of "Surfactant", "KP-341" is a nonionic silicone surfactant (manufactured by Shin-Etsu Chemical Co., Ltd.); "PC-6" is a nonionic surfactant (polynuclear phenol surfactant, manufactured by ADEKA CORPORATION); "TN-80" is a nonionic surfactant (primary alcohol ethoxylate surfactant, manufactured by ADEKA CORPORATION); and "L-64" is a nonionic surfactant (polyoxyethylene-polyoxypropylene condensation compound, manufactured by ADEKA CORPORATION).

Example 2

Formation of Resist Pattern

Each of the resist pattern thickening materials A to O prepared in Example 1 was applied over a surface of a hole pattern which had been formed from an ArF resist ("AR 1244J", manufactured by JSR CORPORATION), the hole pattern having an opening diameter described in the column "Size of unthickened space pattern of resist (before thickening)" in Table 2, by a spin-coating method under the conditions of 1,000 rpm/5 s initially, and subsequently, 3,500 rpm/40 s. Then, the each of the applied resist pattern thickening material was baked under the condition of 110° C./60 s. Next, each of the applied resist pattern thickening materials A to E, J, K, L and N was rinsed with 2.38% by mass of a TMAH alkali developer for 60 seconds and further rinsed with pure water for 60 seconds, and each of the applied resist pattern thickening materials F to I, M and O was rinsed with pure water or 2.38% by mass of a TMAH alkali developer for 60 seconds and further rinsed with pure water for 60 seconds to remove unreacted portions of the respective resist pattern thickening materials A to O, i.e. the portions with no interaction or mixing with each of the resist patterns. Then, each of the resist patterns formed from the resist pattern thickening materials A to O was rinsed to thereby form respective thickened resist patterns.

Table 2 shows the size of a space pattern of resist formed from the obtained thickened resist pattern (shown in the column "Size of thickened space pattern of resist (after thickening)" in Table 2) and the size of the initial resist patterns. The initial resist pattern means a resist pattern having a size of the space pattern of resist formed from the unthickened resist pattern and is shown in the column "Size of unthickened

TABLE 1

| Thickened material | Resin (part by mass) | Compound represented by General Formula (1) (part by mass) | Solvent (part by mass) | Surfactant (part by mass) |
|---|---|---|---|---|
| A | PHS (4) | — | isobutanol (96) | — |
| B | PHS (4) | 4-hydroxybenzyl alcohol (1) | isobutanol (96) | — |
| C | PHS (4) | 2-hydroxybenzyl alcohol (1) | ethylene glycol (40)/ isobutanol (56) | — |
| D | PHS (4) | 2-hydroxybenzyl alcohol (1) | isobutanol (96) | — |
| D' | PHS (4) | 2-hydroxybenzyl alcohol (1) | isobutanol (96) | TN-80 (0.25) |
| E | PHS (4) | 2-hydroxybenzyl alcohol (1) | isobutanol (96) | KP-341 (0.005) |
| F | PVPd (4) | 4-hydroxybenzyl alcohol (1) | isobutanol (80)/ diisopentyl ether (16) | — |
| G | PVPd (4) | 2-hydroxybenzyl alcohol (1) | isobutanol (96) | — |
| G' | PVPd (4) | 2-hydroxybenzyl alcohol (1) | isobutanol (96) | L-64 (0.1) |
| H | PVPd (4) | 2-hydroxybenzyl alcohol (1) | n-butanol (96) | PC-6 (0.003) |
| I | PVPd (4) | 2-amino benzyl alcohol (1) | 3-methyl-3-pentanol (46)/isobutanol (50) | — |
| J | poly($HS_{90}$-$Pd_{10}$) (4) | 2-hydroxybenzyl alcohol (1) | isobutanol (90)/ ethylene glycol (6) | — |
| K | novolac resin (4) | 2,4-dihydroxybenzyl alcohol (1) | isobutanol (36)/ ethylene glycol (60) | — |
| L | PHS (4) | 2-hydroxybenzylamine (1) | isobutanol (96) | — |
| M | PVPd (4) | 2-hydroxybenzylamine (1) | isobutanol (56)/ ethylene glycol (40) | — |
| N | PHS (4) | 2-methoxy benzylamine (1) | isobutanol (96) | — |
| O | PVPd (4) | 2-methoxy benzylamine (1) | 3-methyl-3-pentanol (46)/isobutanol (50) | — | space pattern of resist (before thickening)" in Table 2). In Table 2, the letters "A" to "O" respectively correspond to the resist pattern thickening materials A to O.

TABLE 2

| Thickened material | Size of unthickened space pattern of resist (before thickening) (nm) | Size of thickened space pattern of resist (after thickening) (nm) |
|---|---|---|
| A | 107.5 | 107.3 |
| B | 102.3 | 95.4 |
| C | 106.8 | 98.6 |
| D | 108.7 | 100.6 |
| D' | 105.8 | 88.1 |
| E | 106.1 | 98.3 |
| F | 103.5 | 95 |
| G | 108 | 99.2 |
| G' | 106.3 | 90.3 |
| H | 105.1 | 96.3 |
| I | 104.2 | 97.4 |
| J | 103.9 | 96.9 |
| K | 105.5 | 98.5 |
| L | 105.5 | 94.3 |
| M | 103.3 | 92.4 |
| N | 107.1 | 98.5 |
| O | 106.0 | 94.7 |

The results shown in Table 2 demonstrated that the use of each of the resist pattern thickening materials B to O of the present invention in forming a hole pattern enabled to narrow down the inner diameter of the hole pattern. In the meanwhile, it was found that when the resist pattern thickening material A for Comparative Example containing no compound represented by the General Formula (1) was used for forming a hole pattern, there was almost no change in the inner diameter of the hole pattern, and it was impossible to narrow down the inner diameter. Further, each of the thickened resist patterns formed by using each of the resist pattern thickening materials A to O was not dissolved and no deterioration in shape of these resist patterns was observed.

Example 3

Formation of Resist Pattern

Each of the resist pattern thickening materials D and G prepared in Example 1 was applied over a surface of a lines & spaces pattern which had been formed from an ArF resist ("AR 1244J", manufactured by JSR CORPORATION), the lines & spaces patterns respectively had a space portion having a varied size (the size described in the column "Size of unthickened space pattern of resist (before thickening)" in Table 2, i.e., 110 nm, 200 nm, 300 nm, and 500 nm), by a spin-coating method under the conditions of 1,000 rpm/5 s initially, and subsequently, 3,500 rpm/40 s. Then, the each of the applied resist pattern thickening material was baked under the condition of 110° C./60 s. Next the applied resist pattern thickening material D was rinsed with 2.38% by mass of a TMAH alkali developer for 60 seconds and further rinsed with pure water for 60 seconds. The applied resist pattern thickening material G was rinsed with pure water for 60 seconds and further rinsed with pure water for 60 seconds to remove unreacted portions of the respective resist pattern thickening materials D and G i.e. the portions with no interaction or mixing with each of the resist patterns. As described above, each of the resist patterns formed from the resist pattern thickening materials D and G was developed to thereby form respective thickened resist patterns.

Table 3 shows the reduced amount of the size of a space pattern of resist formed from the obtained thickened resist pattern, i.e., the difference between "Size of thickened space pattern of resist (after thickening)" and "Size of unthickened space patter of resist (before thickening)") and the size of the initial resist patterns. The initial resist pattern means a resist pattern having a size of the space pattern of resist formed from the unthickened resist pattern and is shown in the column "Size of unthickened space pattern of resist (before thickening)" in Table 3). In Table 3, "Thickened material D" and "Thickened material G" respectively correspond to the resist pattern thickening material D and the resist pattern thickening material G.

TABLE 3

| Size of unthickened space pattern of resist (before thickening) (nm) | Reduced amount of size of thickened space pattern of resist (after thickening) (nm) | |
|---|---|---|
| | Thickened material G | Thickened material D |
| 110 | 7.5 | 8.6 |
| 200 | 8.3 | 9.1 |
| 300 | 8.1 | 9.2 |
| 500 | 9.4 | 10.1 |

The results shown in Table 3 demonstrated that the use of each of the resist pattern thickening materials D and G of the present invention in forming a lines & spaces pattern enabled to reduce the width of the space pattern of resist the difference in reactivity, i.e., the difference in reduced amount, between a narrow-width pattern and a relatively wide-width pattern was small i.e., 2 nm or less, and the use of the resist pattern thickening materials D and G enabled to uniformly and finely narrow down the space patterns with less dependence on the size of the lines & spaces patterns.

Example 4

Formation of Resist Pattern

The resist pattern thickening material D of the present invention which was prepared in Example 1 was applied over a surface of a hole pattern having an opening (hole) with an opening diameter of 580 nm, the hole pattern has been formed by an electron beam exposure method using a non-chemically amplified electron beam resist ("NANO 495PMMA" manufactured by MicroChem. Corp., U.S.), by a spin-coating method under the conditions of 1,000 rpm/5 s initially, and subsequently, 3,500 rpm/40 s. Then, the applied resist pattern thickening material was baked under the condition of 110° C./60 s. Next, the applied resist pattern thickening material D was rinsed with pure water for 60 seconds to remove unreacted portions of the resist pattern thickening material D, i.e. the portions with no interaction or mixing with the resist pattern. As described above, each of the resist pattern formed from the resist pattern thickening material D was developed to thereby form a thickened resist pattern. The space pattern of resist formed from the obtained thickened resist pattern had an opening diameter of 450 nm.

The resist pattern thickening material of the present invention enabled to thicken a non-chemically amplified electron beam resist. The result showed that a resist pattern is not thickened by utilizing acids in the resist pattern and the interaction (mixing) is not a crosslinking reaction caused by acid diffusion.

Example 5

Evaluation of Etch Resistance

Each of the resist pattern thickening materials D, G, and K was applied over a surface of a resist formed on a silicon substrate to form a surface layer having a thickness of 0.5 μm.

Further, for comparison with these surface layers, a water-based resist pattern thickening material (comparison material) having the following composition was prepared by using a conventional resin as a base. Then, a surface layer was formed from the comparison material in the same manner as described above.

<Composition of Comparison Material>

| | |
|---|---|
| Base resin: polyvinyl acetal resin ("KW-3", SEKISUI CHEMICAL CO., LTD.) | 16 parts by mass |
| Crosslinker: tetramethoxymethyl glycol uril | 1.35 parts by mass |
| Solvent: 98.6 parts by mass of pure water + 0.4 parts by mass of isopropyl alcohol | |

Each of the obtained surface layers was etched for 3 minutes using an etching device (parallel plate type RIE device, manufactured by FUJITSU LIMITED) under the conditions of Pμ=200 W, pressure=2.666 Pa (0.02 Torr), and $CF_4$ gas 100 sccm. The reduced amount of the sample film was measured to determine the etching rate. Then, a comparative evaluation was carried out on the respective surface layers based on the etching rate of the comparison material. Table 4 shows the measurement results.

TABLE 4

| Material | Etching rate (nm/min) | Ratio of etching rate |
|---|---|---|
| Comparative material | 627 | 1.00 |
| D | 606 | 0.98 |
| G | 589 | 0.94 |
| K | 575 | 0.92 |

The results shown in Table 4 demonstrated that the resist pattern thickening material of the present invention has a remarkably excellent etch resistance as compared to the conventional water-based resist pattern thickening material.

Summarizing the above, the use of the resist pattern thickening material of the present invention enables to uniformly and finely narrow down space patterns of resist with less dependence on the size of resist patterns, and the resist pattern thickening material of the present invention allows for sharing one resist-developing cup without the necessity of setting up a new process line for a new chemical agent for developing because the resist pattern thickening material of the present invention can be developed with pure water or an alkali developer. Further, a thickened resist pattern formed from the resist pattern thickening material of the present invention, which is a nonaqueous material, is excellent in dry etch resistance and also excellent in processability.

Example 6

Flash Memory and Manufacture Thereof

Example 6 illustrates an embodiment of the semiconductor device and the manufacturing process thereof of the present invention using a resist pattern thickening material of the present invention. In Example 6, resist films 26, 27, 29 and 32 are ones thickened by the same method as in Examples 2 and 3 using the resist pattern thickening material of the present invention.

Figure 9:
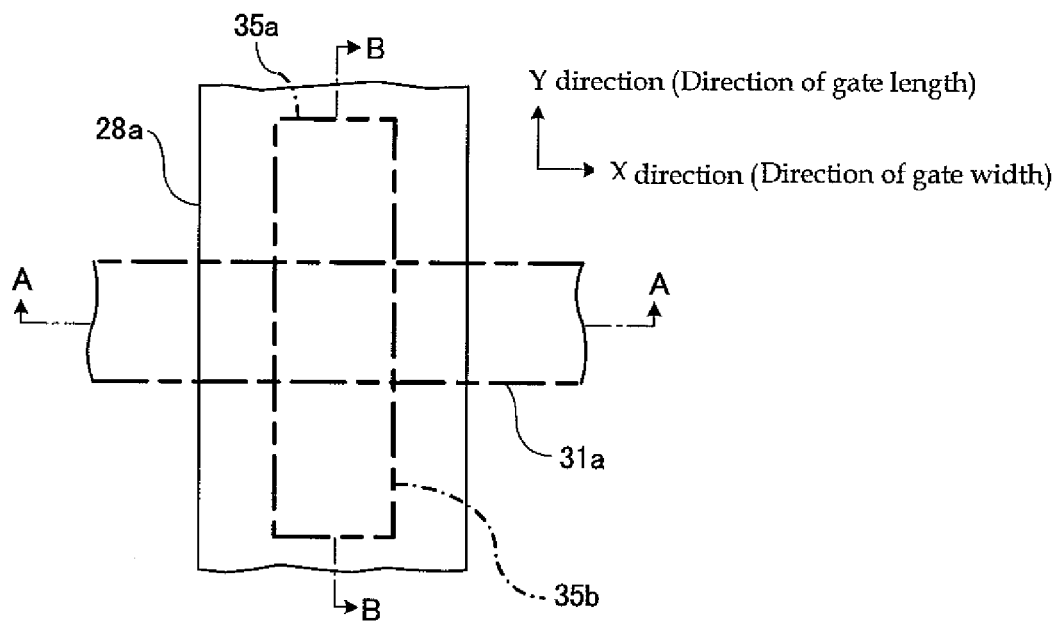
FIG. 9 is a top view for explaining a FLASH EPROM which is one example of a semiconductor device manufactured by the method for manufacturing a semiconductor device of the present invention.
Figure 10:
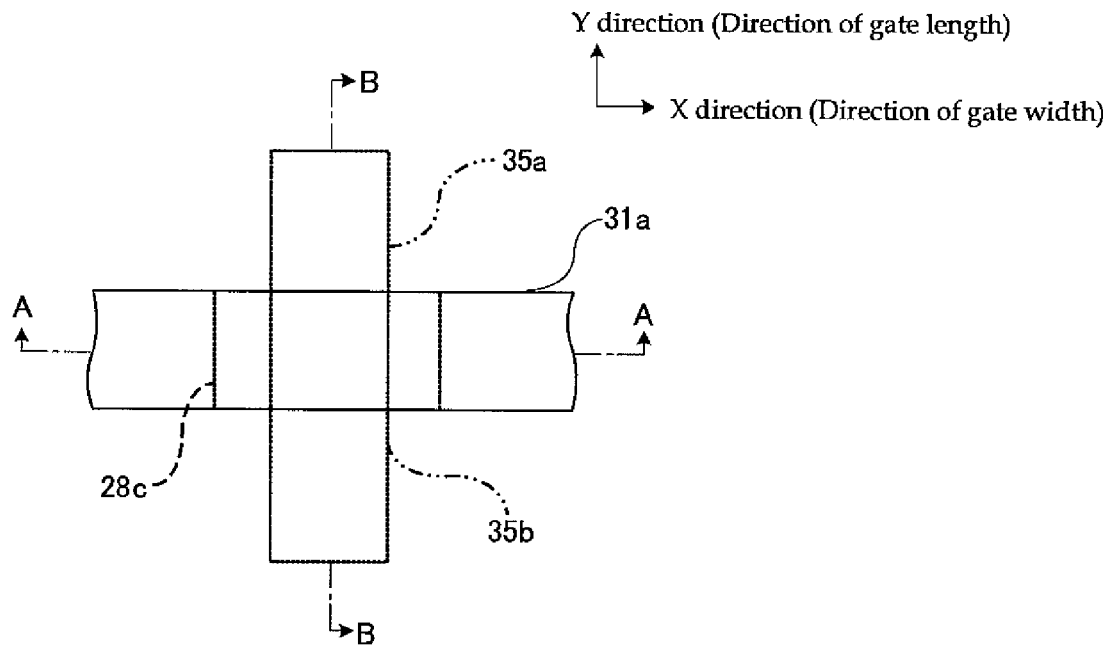
FIG. 10 is a top view for explaining a FLASH EPROM which is another example of a semiconductor device manufactured by the method for manufacturing a semiconductor device of the present invention.

FIGS. 9 and 10 are top views (plan views) of a FLASH EPROM which is called a FLOTOX type or an ETOX type. FIGS. 11 through 19 are schematic cross-sectional views showing a manufacturing process of the FLASH EPROM. In these figures, the left views are schematic sectional views (sectional views taken along lines A-A) of a memory cell unit (a first element region), in a gate width direction (in the X direction in FIGS. 9 and 10), in a portion where a MOS transistor having a floating gate electrode is to be formed. The central views are schematic sectional views (sectional views taken along lines B-B) of the memory cell unit in a gate length direction (in the Y direction in FIGS. 9 and 10) perpendicular to the X direction in the same portion in the left views. The right views are schematic sectional views (sectional views taken along the line A-A in FIGS. 9 and 10) of a portion on which a MOS transistor is to be formed in a peripheral circuit unit (a second element region).

Figure 11:
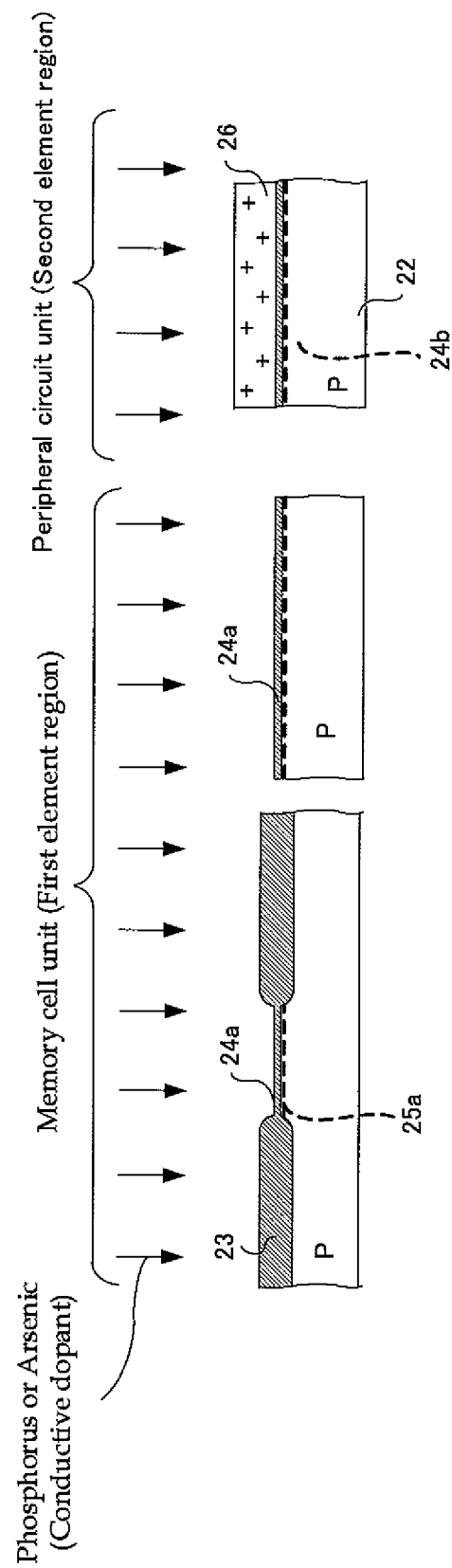
FIG. 11 is a cross-sectional schematic diagram for explaining a method for manufacturing the FLASH EPROM which is an example of the method for manufacturing a semiconductor device of the present invention.

Initially, a $SiO_2$ film was selectively formed in a device isolation region on a p-type Si substrate 22 and thereby yielded a field oxide film 23 of $SiO_2$ film (FIG. 11). Next, a $SiO_2$ film was formed by thermal oxidation so as to have a thickness of 10 nm to 30 nm (100 to 300 angstroms) as a first gate dielectric film 24a in the MOS transistor in the memory cell unit (first element region). In another step, a $SiO_2$ film was formed by thermal oxidation so as to have a thickness of 10 nm to 50 nm (100 to 500 angstroms) as a second gate dielectric film 24b in the MOS transistor in the peripheral circuit unit (second element region). If the first gate dielectric film 24a and the second gate dielectric film 24b should have the same thickness, these oxide films may be simultaneously formed in one step.

Next, the peripheral circuit unit (the right view in FIG. 11) was masked by a resist film 26 to control a threshold voltage for the formation of a MOS transistor having n-type depletion type channels in the memory cell unit (the left and central views in FIG. 11). As an n-type dopant, phosphorus (P) or arsenic (As) was injected into a region to be a channel region directly below the floating gate electrode by ion implantation at a dose of $1\times10^{11}$ $cm^{-2}$ to $1\times10^{14}$ $cm^{-2}$ and thereby yielded a first threshold control layer 25a. The dose and conduction type of the dopant can be appropriately selected depending on whether the channel is a depletion type or an accumulation type.

Figure 12:
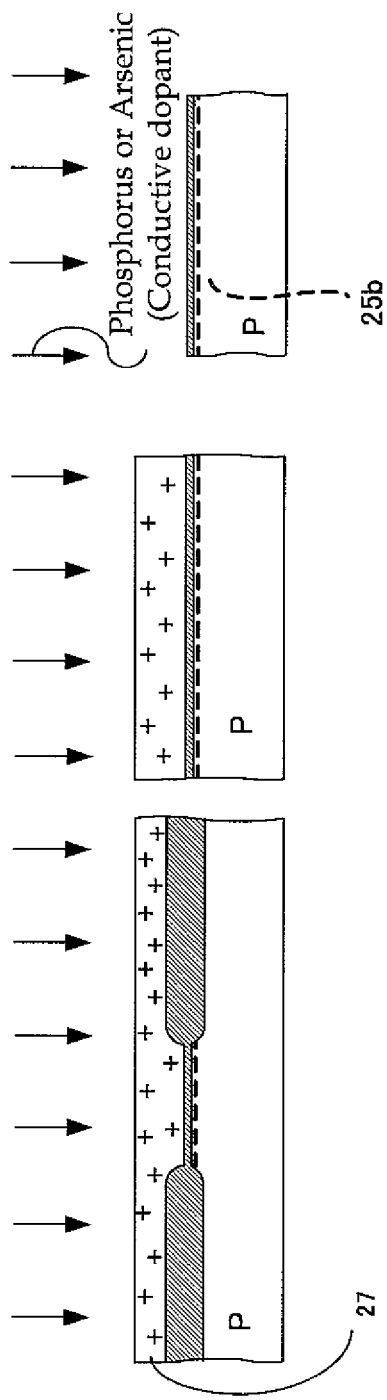
FIG. 12 is a cross-sectional schematic diagram for explaining a method for manufacturing the FLASH EPROM which is an example of the method for manufacturing a semiconductor device of the present invention, and showing a step after the step shown in FIG. 11.

Next, the memory cell unit (the left and central views in FIG. 12) was masked by a resist film 27 to control a threshold voltage for the formation of a MOS transistor having n-type depletion type channels in the peripheral circuit unit (the right view in FIG. 12). As an n-type dopant, phosphorus (P) or arsenic (As) was injected into a region to be a channel region directly below the gate electrode by ion implantation at a dose of $1\times10^{11}$ $cm^{-2}$ to $1\times10^{14}$ $cm^{-2}$ and thereby yielded a second threshold control layer 25b.

Figure 13:
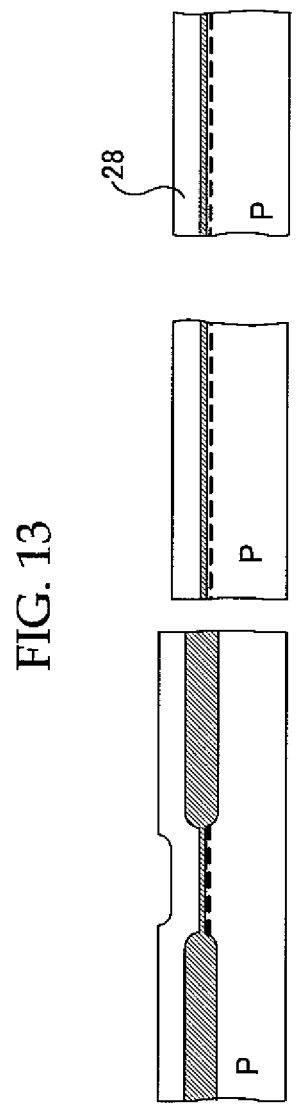
FIG. 13 is a cross-sectional schematic diagram for explaining a method for manufacturing the FLASH EPROM which is an example of the method for manufacturing a semiconductor device of the present invention, and showing a step after the step shown in FIG. 12.

A first polysilicon film (first conductive film) 28 having a thickness of 50 nm to 200 nm (500 to 2,000 angstroms) was formed on the entire surface of the article as a floating gate electrode of the MOS transistor of the memory cell unit (the left and central views in FIG. 13) and as a gate electrode of the MOS transistor in the peripheral circuit unit (the right view in FIG. 13).

Figure 14:
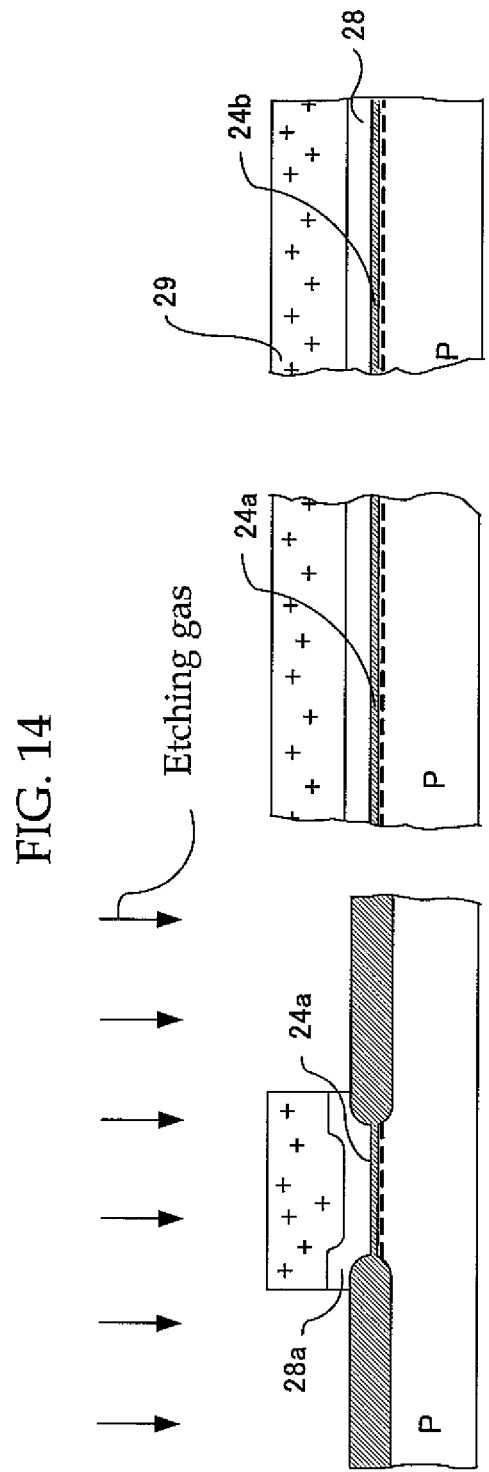
FIG. 14 is a cross-sectional schematic diagram for explaining a method for manufacturing the FLASH EPROM which is an example of the method for manufacturing a semiconductor device of the present invention, and showing a step after the step shown in FIG. 13.

With reference to FIG. 14, a resist film 29 was then formed, the first polysilicon film 28 was patterned using the resist film 29 as a mask and thereby yielded a floating gate electrode 28a in the MOS transistor in the memory cell unit (the left and central views in FIG. 14). In this procedure, the first polysilicon film 28 was patterned in the X direction to be intended dimensions and was not patterned in the Y direction to thereby leave a region to be a source-drain (S/D) layer covered by the resist film 29.

Figure 15:
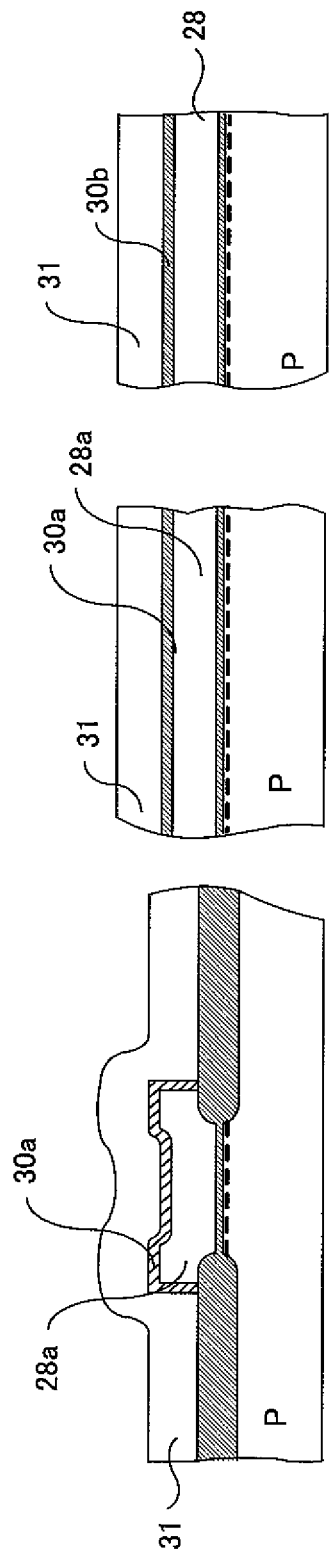
FIG. 15 is a cross-sectional schematic diagram for explaining a method for manufacturing the FLASH EPROM which is an example of the method for manufacturing a semiconductor device of the present invention, and showing a step after the step shown in FIG. 14.

The resist film 29 was stripped, a capacitor dielectric film 30a made of a $SiO_2$ film was formed by thermal oxidation so as to cover the floating gate electrode 28a and to have a thickness of about 20 nm to 50 nm (200 to about 500 angstroms) (the left and central views in FIG. 15). In this procedure, a capacitor dielectric film 30b made of a $SiO_2$ film was also formed on the first polysilicon film 28 in the peripheral circuit unit (the right view in FIG. 15). These capacitor dielectric films 30a and 30b are made of a $SiO_2$ film alone, however, they may include a multilayer film having two or three layers of $SiO_2$ film and $Si_3N_4$ film.

Next, a second polysilicon film (second conductive film) 31 was formed so as to have a thickness of 50 nm to 200 nm (500 to 2,000 angstroms) so as to cover the floating gate electrode 28a and the capacitor dielectric film 30a (FIG. 15). The second polysilicon film 31 serves as a control gate electrode.

Figure 16:
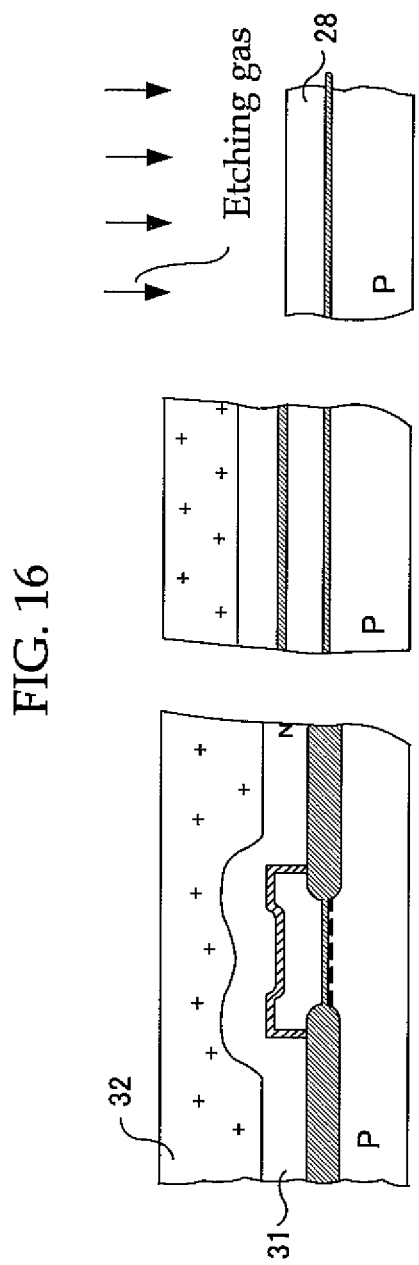
FIG. 16 is a cross-sectional schematic diagram for explaining a method for manufacturing the FLASH EPROM which is an example of the method for manufacturing a semiconductor device of the present invention, and showing a step after the step shown in FIG. 15.

With reference to FIG. 16, the memory cell unit (the left and central views in FIG. 16) was masked by a resist film 32, the second polysilicon film 31 and the capacitor dielectric film 30b in the peripheral circuit unit (the right view in FIG. 16) were stripped in turn by etching to thereby expose the first polysilicon film 28 from the surface.

Figure 17:
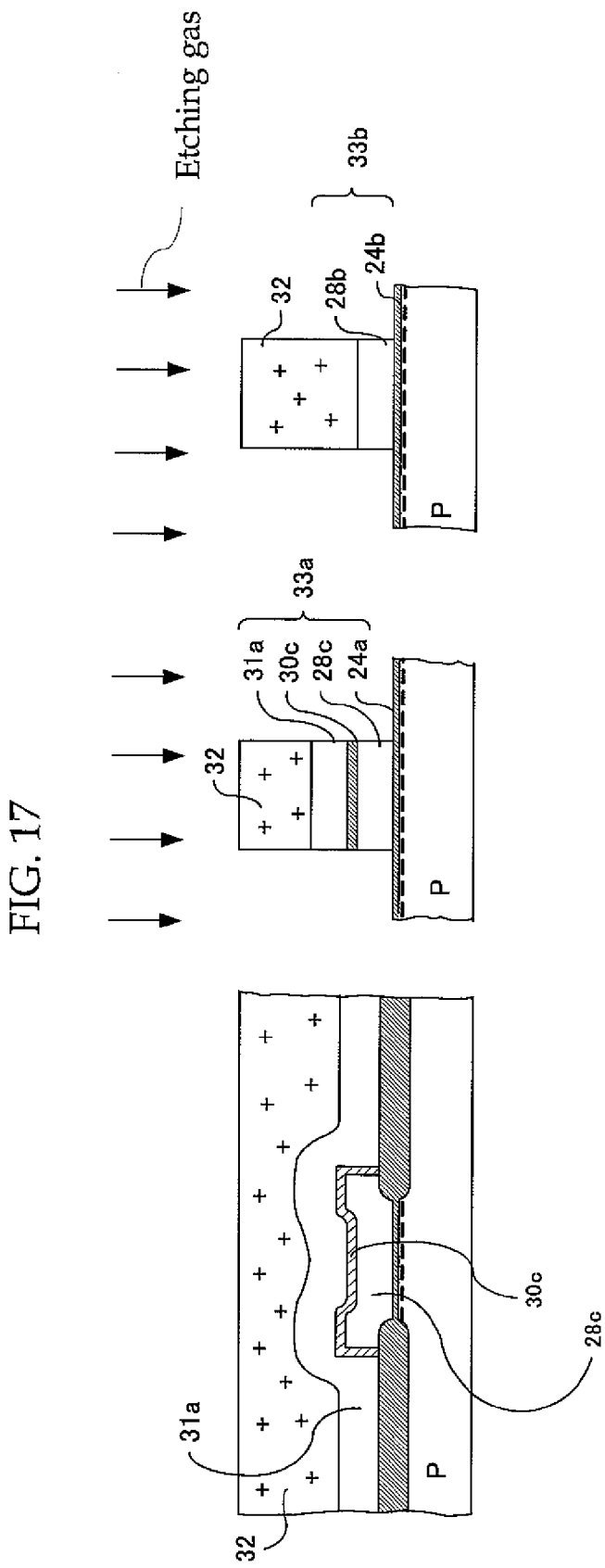
FIG. 17 is a cross-sectional schematic diagram for explaining a method for manufacturing the FLASH EPROM which is an example of the method for manufacturing a semiconductor device of the present invention, and showing a step after the step shown in FIG. 16.
Figure 18:
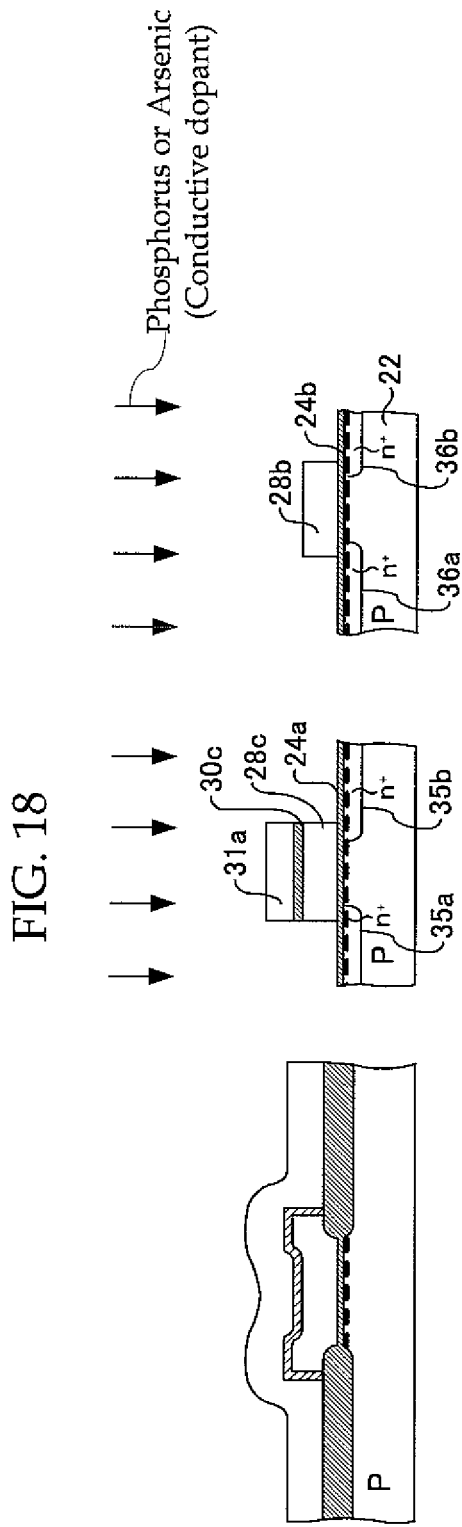
FIG. 18 is a cross-sectional schematic diagram for explaining a method for manufacturing the FLASH EPROM which is an example of the method for manufacturing a semiconductor device of the present invention, and showing a step after the step shown in FIG. 17.

With reference to FIG. 17, the second polysilicon film 31, the capacitor dielectric film 30a, and the first polysilicon film 28a of the memory cell unit (the left and central views in FIG. 17), which first polysilicon film 28a had been patterned only in the X direction, were patterned in the Y direction to target dimensions of a first gate unit 33a using the resist film 32 as a mask. Thus, a multilayer assemblage of a control gate electrode 31a, a capacitor dielectric film 30c, and a floating gate electrode 28c having a width of about 1 µm in the Y direction was formed. In addition, the first polysilicon film 28 in the peripheral circuit unit (the right view in FIG. 17) was patterned to target dimensions of a second gate unit 33b and thereby yielded a gate electrode 28b about 1 µm wide.

Phosphorus (P) or arsenic (As) was injected into the element forming region of the Si substrate 22 by ion implantation at a dose of $1 \times 10^{14}$ $cm^{-2}$ to $1 \times 10^{16}$ $cm^{-2}$ using, as a mask, the multilayer assemblage of the control gate electrode 31a, the capacitor dielectric film 30c, and the floating gate electrode 28c in the memory cell unit (the left and central views in FIG. 18) and thereby yielded n-type source and drain (S/D) region layers 35a and 35b. In addition, phosphorus (P) or arsenic (As) as an n-type dopant was injected into the element forming region of the Si substrate 22 by ion implantation at a dose of $1 \times 10^{14}$ $cm^{-2}$ to $1 \times 10^{16}$ $cm^{-2}$ using the gate electrode 28b in the peripheral circuit unit (the right view in FIG. 18) as a mask and thereby yielded S/D region layers 36a and 36b.

Figure 19:
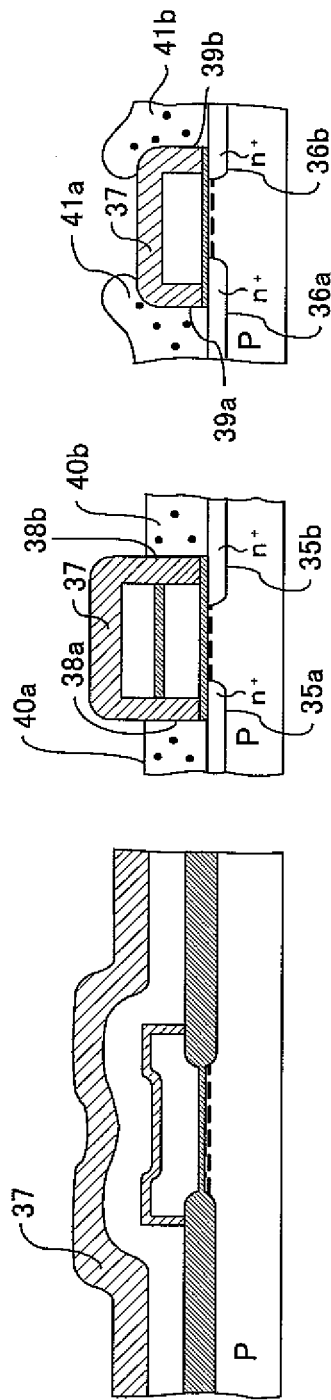
FIG. 19 is a cross-sectional schematic diagram for explaining a method for manufacturing the FLASH EPROM which is an example of the method for manufacturing a semiconductor device of the present invention, and showing a step after the step shown in FIG. 18.

A phosphate-silicate glass film (PSG film) about 500 nm (5000 angstroms) thick was formed as an interlayer dielectric film 37 so as to cover the first gate unit 33a in the memory cell unit (the left and central views in FIG. 19) and the second gate unit 33b in the peripheral circuit unit (the right view in FIG. 19).

Subsequently, contact holes 38a, 38b, 39a, and 39b were formed on the interlayer dielectric film 37 on the S/D region layers 35, 35b, 36a, and 36b, respectively. S/D electrodes 40a, 40b, 41a and 41b were then formed respectively. In order to form the contact holes 38a, 38b, 39a and 39b, the hole pattern was formed from the resist material and then thickened the resist pattern with the resist pattern thickening material according to the present invention, thereby forming fine space pattern of resists (hole patterns). Thereafter, the contact holes were manufactured following a conventional method.

Thus, the FLASH EPROM as a semiconductor device was manufactured (FIG. 19).

In the above-manufactured FLASH EPROM, the second gate dielectric film 24b in the peripheral circuit unit (the right views in FIGS. 11 through 19) remains being covered by the first polysilicon film 28 or the gate electrode 28b after its formation (the right views in FIGS. 11 through 19) and thereby keeps its initial thickness. Accordingly, the thickness of the second gate dielectric film 24b can be easily controlled, and the concentration of a conductive dopant can be easily controlled for the control of the threshold voltage.

In this embodiment the first gate unit 33a is formed by initially patterning in the gate width direction (the X direction in FIGS. 9 and 10) to a set width and then patterning in the gate length direction (the Y direction in FIGS. 9 and 10) to a target width. Alternatively, the first gate unit 33a may be formed by initially patterning in the gate length direction (the Y direction in FIGS. 9 and 10) to a set width and then patterning in the gate width direction (the X direction in FIGS. 9 and 10) to a target width.

Figure 20:
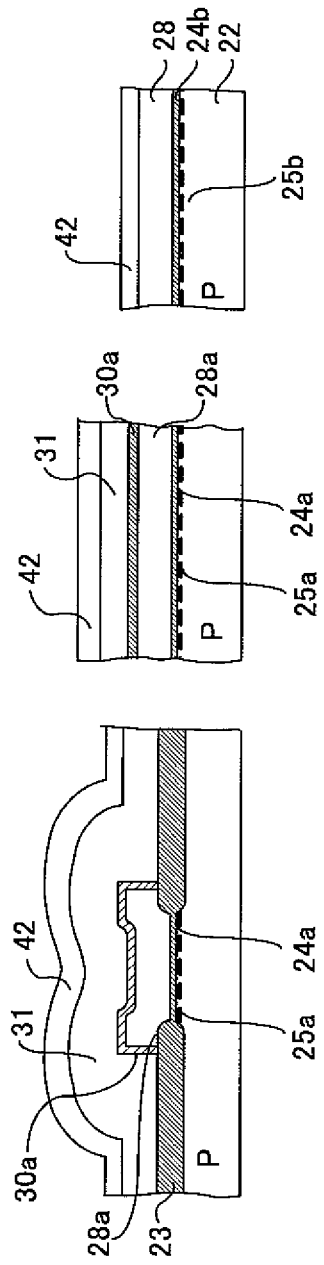
FIG. 20 is a cross-sectional schematic diagram for explaining the method for manufacturing the FLASH EPROM which is another example of the method for manufacturing a semiconductor device of the present invention.
Figure 21:
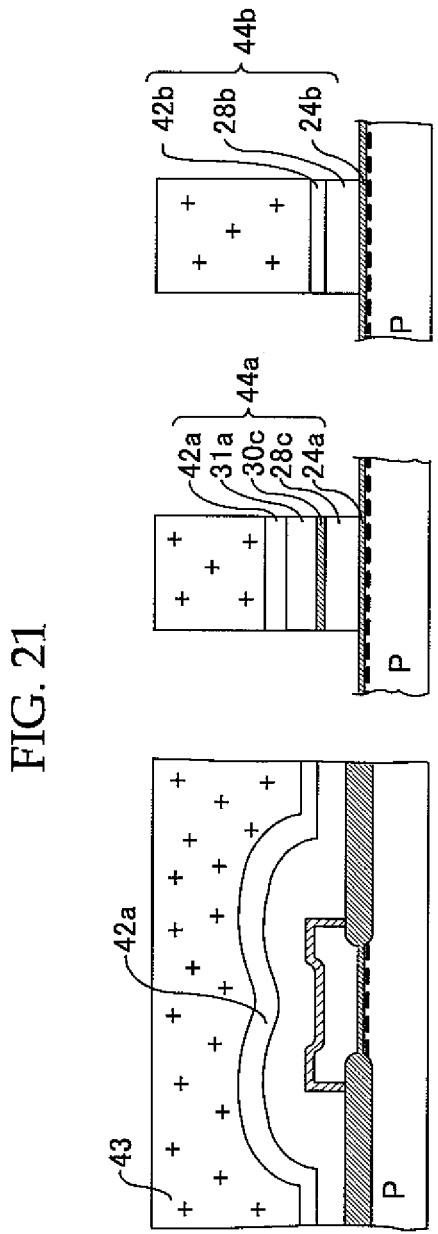
FIG. 21 is a cross-sectional schematic diagram for explaining the method for manufacturing the FLASH EPROM which is another example of the method for manufacturing a semiconductor device of the present invention, and showing a step after the step shown in FIG. 20.

Another FLASH EPROM was manufactured in the same way as in the above embodiment, except that the steps subsequent to the step of FIG. 19 were changed to those shown in FIGS. 20, 29 and 30. This manufacture is similar to the above embodiment, except for the followings. Specifically, a tungsten (W) film or a titanium (Ti) film about 200 nm (2,000 angstroms) thick was formed as a refractory metal film (fourth conductive film) 42 on the second polysilicon film 31 in the memory cell unit (the left and central views in FIG. 20) and the first polysilicon film 28 in the peripheral circuit unit (the right view in FIG. 20) and thereby yielded a polycide film. The steps of FIGS. 21 and 22 subsequent to the step of FIG. 20 were carried out in the same manner as in FIGS. 17, 18, and 19 and a detail description thereof is omitted. The same components in FIGS. 20, 21, and 92 as in FIGS. 17, 18, and 19 have the same reference numerals.

Figure 22:
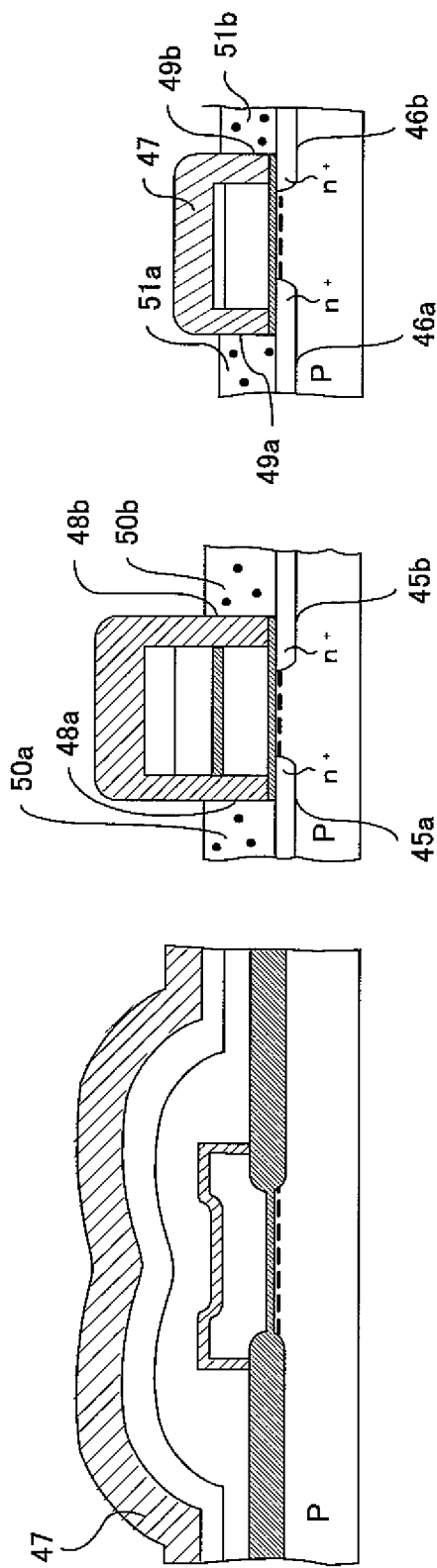
FIG. 22 is a cross-sectional schematic diagram for explaining the method for manufacturing the FLASH EPROM which is another example of the method for manufacturing a semiconductor device of the present invention, and showing a step after the step shown in FIG. 21.

Thus, a FLASH EPROM as a semiconductor device was manufactured (FIG. 22).

The above-manufactured FLASH EPROM has the refracrory metal films (fourth conductive films) 42a and 42b on the control gate electrode 31a and the gate electrode 28b and can thereby further reduce its electrical resistance.

In this embodiment, the refracrory metal films 42a and 42b are used as the fourth conductive films. Alternatively, refractory metal silicide films such as titanium silicide (TiSi) films can be used.

Figure 23:
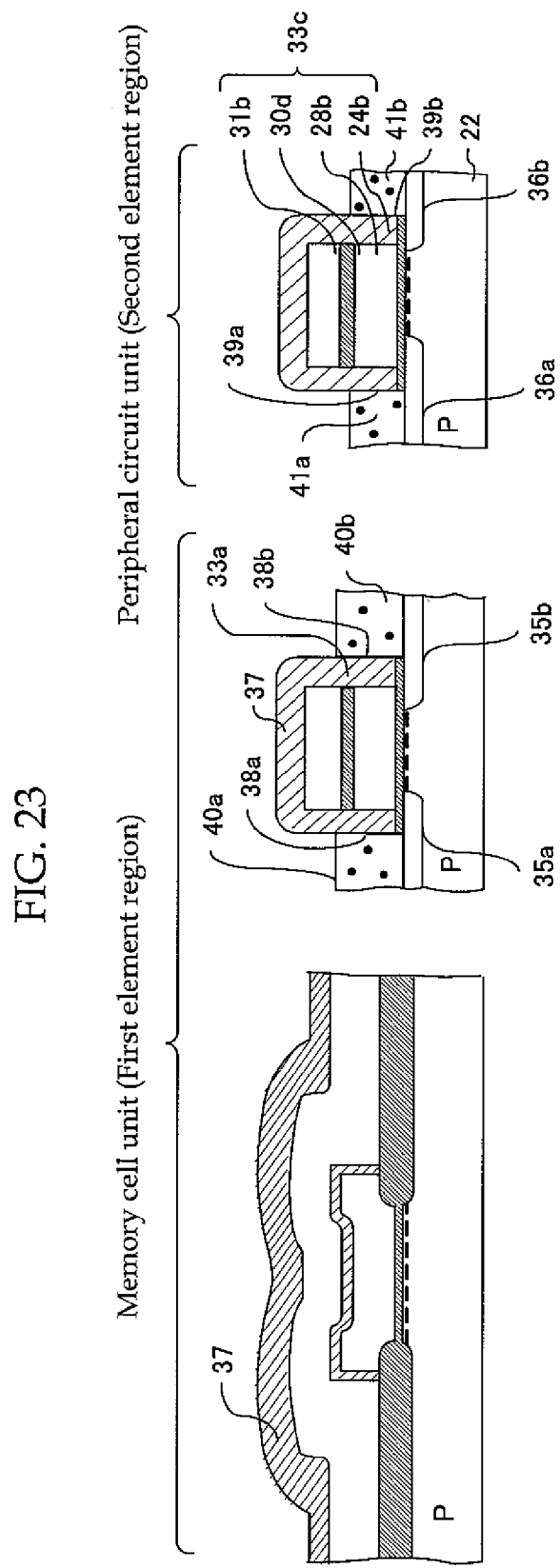
FIG. 23 is a cross-sectional schematic diagram for explaining the method for manufacturing the FLASH EPROM which is yet another example of the method for manufacturing a semiconductor device of the present invention.
Figure 24:
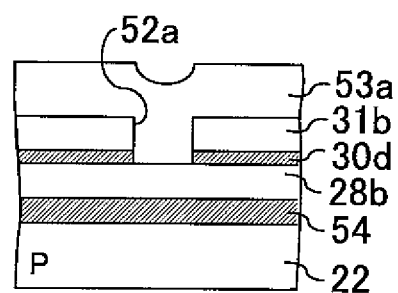
FIG. 24 is a cross-sectional schematic diagram for explaining the method for manufacturing the FLASH EPROM which is yet another example of the method for manufacturing a semiconductor device of the present invention, and showing a step after the step shown in FIG. 23.
Figure 25:
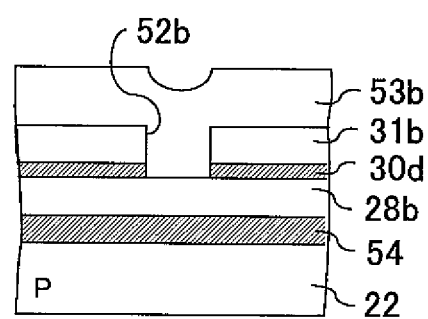
FIG. 25 is a cross-sectional schematic diagram for explaining the method for manufacturing the FLASH EPROM which is yet another example of the method for manufacturing a semiconductor device of the present invention, and showing a step after the step shown in FIG. 24.

Yet another FLASH EPROM was manufactured by the manufacture procedure as in the above-mentioned embodiment, except for steps shown in FIGS. 23, 24, and 25. Specifically, a second gate unit 33c in the peripheral circuit unit (second element region) (the right view in FIG. 23) has a multilayer structure equipped with a first polysilicon film (first conductive film) 28b, a $SiO_2$ film (capacitor dielectric film) 30d, and a second polysilicon film (second conductive film) 31b arranged in this order as in the first gate unit 33a in the memory cell unit (the left and central views in FIG. 23). The first polysilicon film 28b and the second polysilicon film 31b are shortened and thereby form a gate electrode (FIGS. 24 and 25).

More specifically, with reference to FIG. 24, the first polysilicon film 28b and the second polysilicon film 31b are shortened by forming an opening 52a penetrating the first polysilicon film (first conductive film) 28b, the $SiO_2$ film (capacitor dielectric film) 30d and the second polysilicon film (second conductive film) 31b at another portion than the second gate unit 33c shown in FIG. 23, for example, on the dielectric film 54, and filling the opening 52a with a refractory metal film (third conductive film) 53a such as a W film or a Ti film. Alternatively, with reference to FIG. 25, the first polysilicon film 28b and the second polysilicon film 31b may be shortened by forming an opening 52b penetrating the first polysilicon film (first conductive film) 28b and the $SiO_2$ film (capacitor dielectric film) 30d, thereby exposing the lower first polysilicon film 28b at the bottom of the opening 52b, and filling the opening 52b with a refractory metal film 53b such as a W film or a Ti film.

In the above-manufactured FLASH EPROM, the second gate unit 33c in the peripheral circuit unit has the same structure as the first gate unit 33a in the memory cell unit. Accordingly, the memory cell unit and the peripheral circuit unit can be formed by the same step to thereby efficiently simplify steps of the manufacture process.

In this embodiment, the third conductive film 53a or 53b and the refractory metal film (fourth conductive film) 42 were formed independently. Alternatively, these films may be formed simultaneously as a refractory metal film in common.

The present invention aims at solving the shortcomings in the prior art, and can achieve the following objects.

The present invention can provide a resist pattern thickening material which can utilize also an ArF (argon fluoride) excimer laser light as an exposure light during patterning; which is capable of thickening a resist pattern such as a lines & spaces pattern without depending on the size of a resist pattern to be thickened by only applying the resist pattern thickening material over the surface of the formed resist pattern formed from the ArF resist or the like; which can be rinsed with water or an alkaline developer; which is excellent in etch resistance; and which is capable of forming a fine space pattern of resist, exceeding exposure limits (resolution limits) of light sources of available exposure devices, at low cost, easily, and efficiently.

The present invention can also provide a method for forming a resist pattern which, during patterning a resist pattern, can utilize also an ArF excimer laser light as an exposure light without the necessity of setting up a new device; which is capable of thickening a resist pattern such as a lines & spaces pattern without depending on the size of a resist pattern to be thickened; and which is capable of forming a fine space pattern of resist, exceeding exposure limits (resolution limits) of light sources of available exposure devices, at low cost, easily, and efficiently.

Further, the present invention can provide a method for manufacturing a semiconductor device in which, during patterning a resist pattern, ArF excimer laser light can be utilized as a light source without the necessity of setting up a new device; a fine space pattern of resist, exceeding exposure or resolution limits of light sources of available exposure devices, can be formed; and which can efficiently mass-produce a high performance semiconductor having a fine interconnection pattern formed using the space patter of resist, and is to also provide a high performance semiconductor which is manufactured by the method for manufacturing a semiconductor device and has fine interconnection patterns.

The resist pattern thickening material of the present invention can be preferably used when finely forming a pattern such as a space pattern of resist and an interconnection pattern, while thickening a resist pattern formed from, e.g., ArF resist and using an exposure light during patterning, exceeding exposure or resolution limits of light sources of available exposure devices, at low cost, easily and efficiently. The resist pattern thickening material of the present invention is also preferably used in a variety of patterning methods, semiconductor device manufacturing processes, etc. and particularly preferably used in the method for forming a resist pattern of the present invention and the method for manufacturing a semiconductor device of the present invention.

The method for forming a resist pattern of the present invention is preferably used in manufacturing functional parts such as mask patterns, reticle patterns, magnetic heads, LCDs (liquid crystal displays), PDPs (plasma display panels), SAW filters (surface acoustic wave filters); optical parts used in connecting optical wiring; fine parts such as microactuators; semiconductor devices; and the like, and can be suitably employed in the method for manufacturing a semiconductor device of the present invention.

The method for manufacturing a semiconductor device of the present invention is preferably used in manufacturing procedures of various semiconductor devices such as flash memory, DRAMs, FRAMs.

What is claimed is:
1. A resist pattern thickening material, comprising:
a resin which is at least any one of a novolak resin and a polyparahydroxystyrene resin,
a compound represented by the following General Formula (1), and
a non-aqueous solvent,
wherein the resist pattern thickening material is nonaqueous and contains no acid generator and no crosslinker,

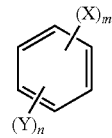

General Formula (1)

where "X" represents a functional group represented by the following Structural Formula (1); "Y" represents at least any one of a hydroxyl group, an amino group, an alkyl group-substituted amino group, an alkoxy group, an alkoxycarbonyl group, and an alkyl group, and the number of substituents in an amino group substituted by alkyl groups is an integer of 1 or 2; "m" is an integer of 1 or more; and "n" is an integer of 0 or more,

Structural Formula (1)

where "$R^1$" and "$R^2$" may be same to each other or different from each other and respectively represent a hydrogen atom or a substituent group; "Z" represents at least any one of a hydroxyl group, an amino group, an alkyl group-substituted amino group, and an alkoxy group, and the number of substituents in an amino group substituted by alkyl groups is an integer of 1 or 2,
wherein the non-aqueous solvent comprises any one of ethylene glycol and propylene glycol,
wherein a content of the compound represented by the General Formula (1) in the resist pattern thickening material is 0.1 parts by mass to 10 parts by mass, and wherein the non-aqueous solvent comprises ethylene glycol, and a content of ethylene glycol in the non-aqueous solvent is 6% by mass to 63% by mass.

2. The resist pattern thickening material according to claim 1, being water-soluble or alkali-soluble.

3. The resist pattern thickening material according to claim 1, wherein in the General Formula (1), "m" is an integer of 1.

4. The resist pattern thickening material according to claim 1, further comprising a surfactant.

5. The resist pattern thickening material according to claim 4, wherein the surfactant is at least one selected from polyoxyethylene-polyoxypropylene condensation compounds, polyoxyalkylene alkyl ether compounds, polyoxyethylene alkyl ether compounds, polyoxyethylene derivative compounds, sorbitan fatty acid ester compounds, glycerine fatty acid ester compounds, primary alcohol ethoxylate compounds, phenol ethoxylate compounds, nonylphenol ethoxylate compounds, octylphenol ethoxylate compounds, lauryl alcohol ethoxylate compounds, oleyl alcohol ethoxylate compounds, fatty acid ester surfactants, amide surfactants, natural alcohol surfactants, ethylene diamine surfactants, secondary alcohol ethoxylate compounds, alkyl cationic surfactants, amide-type quaternary cationic surfactants, ester-type quaternary cationic surfactants, amine oxide surfactants, betaine surfactants, and silicone surfactants.

6. The resist pattern thickening material according to claim 4, wherein the content of the surfactant in the resist pattern thickening material is 0.005 parts by mass or more relative to 100 parts by mass of the resist pattern thickening material.

7. The resist pattern thickening material according to claim 1, wherein the resin is the polyparahydroxystyrene resin.

* * * * *